United States Patent [19]

Suzuki et al.

[11] Patent Number: 5,024,923
[45] Date of Patent: Jun. 18, 1991

[54] INFRARED ABSORBENT COMPOSITIONS

[75] Inventors: Yoshiaki Suzuki; Gouichi Hayashi, both of Minami-ashigara, Japan

[73] Assignee: Fuji Photo Film Co., Ltd., Kanagawa, Japan

[21] Appl. No.: 242,691

[22] Filed: Sep. 9, 1988

[30] Foreign Application Priority Data

Sep. 9, 1987 [JP] Japan .................................. 62-226133
Sep. 19, 1987 [JP] Japan .................................. 62-234103

[51] Int. Cl.$^5$ ........................... G02B 5/20; F21V 9/04
[52] U.S. Cl. ..................................... 430/372; 430/517; 430/944; 430/945; 252/587; 350/311; 350/1.1; 546/270; 556/136; 556/146
[58] Field of Search ............... 430/372, 944, 517, 945; 350/311, 1.1; 556/113, 136, 146; 546/270, 136, 146; 252/587

[56] References Cited

U.S. PATENT DOCUMENTS

| | | | |
|---|---|---|---|
| 4,675,423 | 6/1987 | Schrott et al. ...................... | 556/136 |
| 4,730,902 | 3/1988 | Suzuki et al. . | |
| 4,761,181 | 8/1988 | Suzuki ................................. | 430/372 |
| 4,763,966 | 8/1988 | Suzuki et al. ....................... | 350/311 |
| 4,767,571 | 8/1988 | Suzuki et al. ....................... | 252/587 |
| 4,791,023 | 12/1988 | Suzuki et al. . | |

OTHER PUBLICATIONS

New Multi-Sulfur 1,2-Dithiolene Complexes-Preparation, Structure, and Electrochemical Properties, Bull. Chem. Soc. Jpn., 59, 627-630 (1986).

Primary Examiner—Hoa Van Le
Assistant Examiner—Thorl Chea
Attorney, Agent, or Firm—Birch, Stewart, Kolasch & Birch

[57] ABSTRACT

The present invention relates to an infrared absorbent composition comprising at least one of the metal complex compounds represented by formulae (I) or (II):

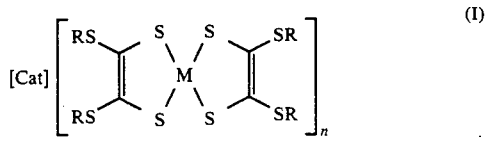

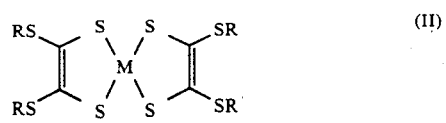

wherein [Cat] represents a cation necessary for neutralizing the complex; n represents 1 or 2; M represents Cu, Co, Ni, Pd, or Pt; and R represents a substituted or unsubstituted alkyl group, a substituted or unsubstituted aryl group, or a substituted or unsubstituted heterocyclic group; and two R's in the same ligand may combine with each other to form a ring.

24 Claims, 3 Drawing Sheets

INFRARED ABSORBENT COMPOSITIONS

FIELD OF THE INVENTION

This invention relates to a near infrared absorbent composition, and more specifically to an infrared absorbent composition useful as an optical filter which absorbs from far infrared light to near infrared light having wavelengths of 600 nm or longer without adversely affecting the transmission of visible light.

BACKGROUND OF THE INVENTION

An infrared absorbent composition which selectively absorbs from far infrared light to near infrared light having wavelengths of 600 nm or longer has hitherto been strongly desired for various uses but suitable compositions have not yet been obtained. The main uses of conventional infrared absorbent compositions are explained hereinbelow with regard to the following five examples.

(1) Safelight filter for infrared-sensitive light-sensitive material:

Recently, many silver halide light-sensitive materials having sensitivity from far infrared light to near infrared light having wavelengths of 700 nm or longer have been developed. For instance, an infrared sensitivity may be imparted to silver halide light-sensitive materials including ordinary photographic materials such as black-and-white photographic materials and color photographic materials and to instant type photographic materials and heat developable photographic materials in order to provide pseude color photographic materials. These materials may be used to survey resources and are capable of being exposed using a diode emitting infrared light.

A panchromatic safelight filter has previously been used for such infrared-sensitive light-sensitive materials.

(2) Controlling the growth of plants:

The formation, growth and differentiation of plants, such as the germination of seeds, the growth of stalks, the expansion of leaves, the formation of the tubers of flower buds, etc., are known to be influenced by light. This influence of light on plant formation has been previously studied.

A plastic film capable of selectively absorbing light having wavelengths of 700 nm or longer has the effect of, for example, delaying the time of earing and controlling the growth of the ear when it is used to cover the crops at a specific time (see, Katsumi Inada, Shokubutsu no Kaqaku Chosetsu (Chemical Control of Plants), Vol, 6, No.1, (1971).

(3) Interception of thermal radiation:

The radiation energy of the sun contains light in the range of from near infrared to far infrared having wavelengths of 800 nm or longer. When this light is absorbed by a substance it is converted into heat energy. The greater part of the energy distribution of such light which is converted into heat energy is concentrated in the near infrared region having wavelengths of from 800 to 2,000 nm. Accordingly, a film capable of selectively absorbing near infrared rays is very effective for intercepting the solar heat. The use of such a film in a room would allow the temperature increase in the room to be sufficiently controlled while allowing the entrance of a sufficient amount of visible light. These films can be applied to greenhouses for gardening as well as to houses, offices, stores, and to the windows of cars or planes, etc.

A plastic film having a vapor-deposited thin metal layer and glass having dispersed therein an inorganic compound such as FeO, etc., have previously been used for intercepting the thermal radiation of the sun.

(4) Cut filter for infrared rays harmful to human eyes:

One of the main uses of an infrared cut filter is in glasses for protecting human eyes from light such as the above-mentioned harmful infrared rays. For example, the infrared cut filter may be used in sun glasses, protective glasses for welders, etc.

(5) Infrared cut filter for a semiconductor light-receiving element:

A silicon photo diode (hereinafter referred to as SPD) is currently used as a light-receiving element for a photodetector which may be used in an automatic exposure meter of a camera. For example, JP-A-61-11704 shows graphs of the relative luminosity curves and the relative values (spectral sensitivity) of the output of an SPD for each wavelength. (The term "JP-A" as used herein means an "unexamined published Japanese patent application").

When using an SPD for an exposure meter, it is necessary to cut the light of the infrared region, which the human eye is insensitive to, such that the spectral sensitivity curve of the SPD shown in FIG. 4 of the aforesaid patent application becomes similar to the relative sensitivity curve shown therein. In particular, since light of the wavelength region of from 700 to 1,100 nm causes a large output of the SPD and the human eye is insensitive to light of this region, the light of this region is a factor for causing an error in the exposure meter. Thus, if an infrared absorbent plastic film which absorbs less visible light and absorbs infrared light over the entire region of from 700 to 1,100 nm can be used, it is clear that light of the visible wavelength region will be largely transmitted and the output of the SPD by visible light is increased, whereby the performance of exposure meter is greatly improved.

Hitherto, an SPD having an infrared cut filter composed of glass containing an inorganic infrared absorbent at the front surface thereof has been used as a kind of photodetector.

However, almost all of the conventional organic dye series infrared absorbents are inferior in light fastness and heat resistance and are insufficient for practical use.

Also, conventional filters which are used for the aforesaid various uses have the following disadvantages.

First, since conventional panchromatic safelight filter for the aforesaid use (1) not only partially transmits green light having high luminosity but also transmits a large amount of infrared light, the use of such filter results in light fog. Accordingly, these materials cannot be sufficiently used as a safelight for infrared light-sensitive materials.

Also, since a plastic film having a vapor-deposited metal layer or a glass having dispersed therein FeO for the aforesaid use (3) strongly absorbs not only infrared light but also visible light, the illuminance in the inside of the room, etc., shaded by such a film or a glass plate is lowered. Thus, the use of such a plastic film for agriculture is inadequate since it causes an absolute shortage of sunshine.

Furthermore, an infrared ray cut filter composed of glass using an inorganic infrared absorbent used for the aforesaid use (5) is comparatively fast to heat and light but shows a low light transmittance in the visible wavelength region. Therefore, the reduction in light transmittance is compensated by increasing the sensitivity of the SPD. However, increasing the sensitivity of the SPD results in an increase of the leak current which results in errors in the photodetector, and also results in a large problem from the point of reliability. Also, since the infrared ray cut filter is composed of an inorganic substance, the filter is lacking in flexibility from the viewpoint of the production of the photodetector and it is difficult at present to improve the production process theeof. Still further, the infrared cut filter composed of an inorganic substance is high in production cost, which results in greatly increasing the cost of the photodetector.

As described above, a photodetector using the inorganic cut filter may have a spectral sensitivity near the relative luminosity curve thereof, but it has serious disadvantages from the viewpoints of reducing the operation performance of the photodetector, increasing the production cost, and improving the production process thereof.

Also, a near infrared absorbent plastic film using a complex as the infrared absorbent has deficient solubility in an organic solvent, which is a large problem in the case of forming a thin plastic film thereof.

Moreover, in the uses described above, it is desired in an SPD filter that the filter is composed of a very thin film and shows a good infrared absorption efficiency. For this purpose, it is required that a large amount of an infrared absorbent is dispersed in a resin for the film but an infrared absorbent having less solubility in an organic solvent cannot meet the purpose.

Furthermore, a conventional near infrared absorbent plastic film using a metal complex as the infrared absorbent has a short maximum absorption wavelength and, in particular, is unsuitable for use in the light-receiving element of a semiconductor laser.

SUMMARY OF THE INVENTION

A first object of this invention is, therefore, to provide an infrared absorbent having an absorption maximum in the long wavelength side, in particular, the wavelength region of 900 nm or longer.

A second object of this invention is to provide a near infrared absorbent having high solubility in an organic solvent and high compatibility with a film-forming binder.

As a result of the various investigations for attaining the aforesaid objects, the inventors have succeeded in accomplishing this invention.

Thus, the aforesaid objects can be attained by the present invention as described hereinbelow.

According to this invention, there is provided an infrared absorbent composition comprising at least one of the metal complex compounds represented by formulae (I) or (II):

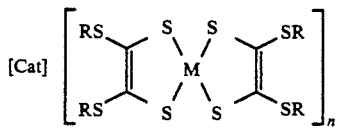 (I)

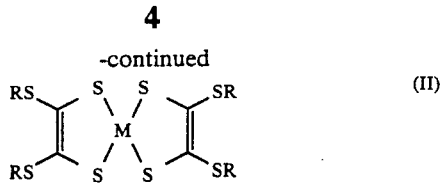 (II)

wherein [Cat] represents a cation necessary for neutralizing the complex; n represents 1 or 2; M represents Cu, Co, Ni, Pd, or Pt; and R represents a substituted or unsubstituted alkyl group, a substituted or unsubstituted aryl groups, or a substituted or unsubstituted heterocyclic group; and two R's in the same ligand may combine with each other to form a ring. The composition also contains a suitable binder.

DETAILED DESCRIPTION OF THE INVENTION

Figure 1:
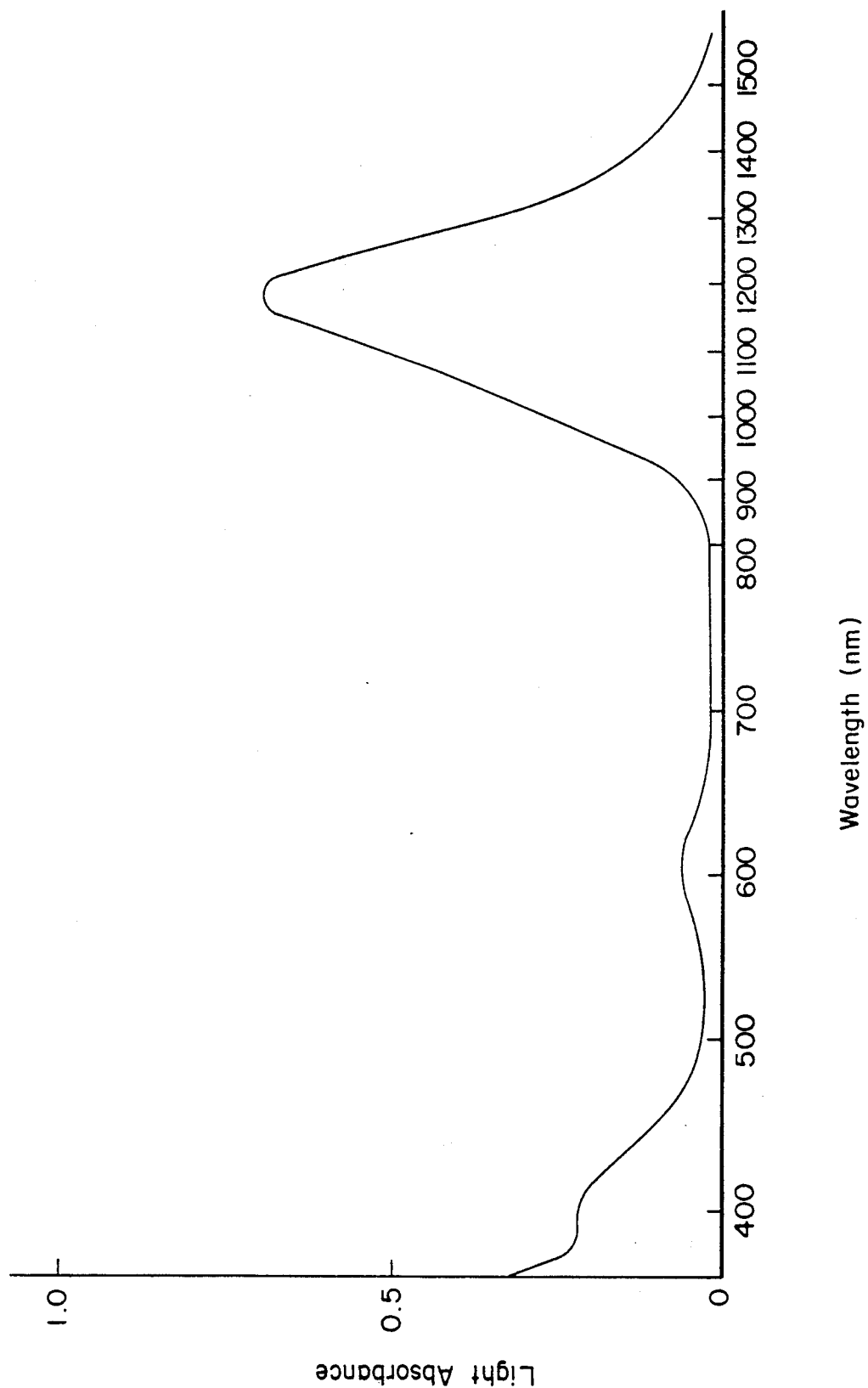
FIG. 1 is a graph showing the electron spectrum of Compound (3)

The invention is explained in detail hereinbelow.

Suitable divalent inorganic cations represented by Cat in formula (I) described above include alkaline earth metal cations such as $Mg^{++}$, $Ca^{++}$, $Sr^{++}$, and $Ba^{++}$.

Suitable divalent organic cations represented by Cat in formula (I) described above include bis-onium ions such as bis-ammonium ion and bis-phosphonium ion.

Suitable monovalent inorganic cations represented by Cat in formula (I) described above include alkali metal cations (such as $Li^+$, $Na^+$, and $K^+$) and $NH_4+$.

Also, representative monovalent organic cations represented by Cat in formula (I) described above include onium ions such as quaternary ammonium ions, quaternary phosphonium ions, and tertiary sulfonium ions.

Of the aforesaid onium ions, those shown by the following formulae (Ia), (Ib), (Ic), (Id), (Ie), and (If) are preferably used in this invention:

 (Ia)

 (Ib)

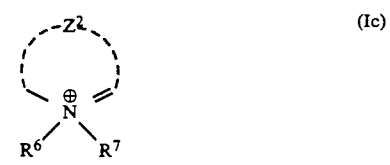 (Ic)

 (Id)

-continued

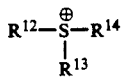
(Ie)

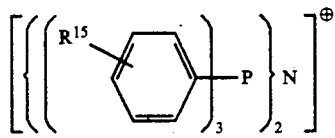
(If)

wherein $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, and $R^{15}$ each independently represents an alkyl group having from 1 to 20 carbon atoms (excluding the carbon atom number of a substituent moiety, if any) or an aryl group having from 6 to 14 carbon atoms (excluding the carbon atom number of a substituent moiety, if any).

Representative examples of the alkyl group shown by $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, or $R^{15}$ include methyl group, n-butyl group, iso-amyl group, n-dodecyl group and n-octadecyl group. Also, representative examples of the aryl group shown by $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, or $R^{15}$ include phenyl group and α-naphthyl group.

The aforesaid alkyl group or aryl group may be substituted by cyano group, a halogen atom (e.g., fluorine, chlorine, and bromine), an alkyl group having from 1 to 20 carbon atoms (e.g., methyl, ethyl, n-butyl, n-octyl, hexadecyl, octadecyl, and methoxyethoxyethyl), an aryl group having from 6 to 14 carbon atoms (e.g., phenyl, tolyl, α-naphthyl, and methoxyphenyl), an aralkyl group having from 7 to 30 carbon atoms (e.g., benzyl, 6-phenyloctyl, and anisyl), an alkoxy group (e.g., methoxy, ethoxy, propoxy, butoxy, and methoxyethoxy), an aryloxy group (e.g., phenoxy, tolyloxy, and methoxyphenoxy), an alkoxycarbonyl group (e.g., methoxycarbonyl, ethoxycarbonyl, n-butoxycarbonyl, and phenoxymethoxycarbonyl), an aryloxycarbonyl group (e.g., phenoxycarbonyl, tolyloxycarbonyl, and methoxyphenoxycarbonyl), an acyl group (e.g., acetyl, benzoyl, and p-methoxybenzoyl), an acyloxy group (e.g., acetoxy, benzoyloxy, and p-methoxybenzoyloxy), an acylamino group (e.g, acetamido, benzamido, and methoxyacetamido), an anilino group (e.g., phenylamino, N-methylanilino, N-phenylanilino, and N-acetylanilino), an alkylamino group (e.g., n-butylamino, N,N-diethylamino, and 4-methoxy-n-butylamino), a carbamoyl group (e.g., n-butylcarbamoyl, N,N-diethylsulfamoyl, n-dodecylsulfamoyl, and N-(4-methoxy-n-butyl)sulfamoyl), a sulfonylamino group (e.g, methylsulfonylamino, phenylsulfonylamino, and methoxymethylsulfonylamino), or a sulfonyl group (e.g., mesyl group, tosyl group, and methoxymethanesulfonyl).

Furthermore, in formulae (Ib) and (Ic) described above, $Z^1$ and $Z^2$ each represents a non-metallic atomic group necessary for forming a substituted or unsubstituted 5-membered or 6-membered ring. Representative examples of the 5-membered or 6-membered ring which is formed by the non-metallic atomic group are a pyridine ring, an imiazole ring, a pyrrole ring, a 2-pyrroline ring, a pyrrolidine ring, a piperidine ring, a pyrazole ring, a pyrazoline ring, and an imidazoline ring. The 5-membered or 6-membered ring may be substituted by a substituent illustrated above which may be substituents for the groups shown for $R^1$ to $R^{15}$.

Suitable cations represented by formula (Ia) described above include tetrabutylammonium ions, hexadecylbenzylmethylammonium ions, tetramethylammonium ions, tetraethylammonium ions, hexadecyltrimethylammonium ions, etc.

Suitable cations represented by formula (Ib) include dodecylpyridinium ions, hexadecylpyridinium ions, dodecylimidazolium ions, etc.

Suitable cations represented by formula (Ic) include N-ethyl-N-hexadecylpiperidinium ions, N-ethyl-N-dodecylpyrazolidinium ions, etc.

Suitable cations represented by formula (Id) include tetrabutylphosphonium ions, trihenylbenzylphosphonium ions, triphenylbutylphosphonium ions, hexadecyltributylphosphonium ions, etc.

Suitable cations represented by formula (Ie) include hexadecylmethylethylsulfonium ions, dodecylmethylethylsulfonium ions, etc.

Also, suitable cations represented by formula (If) include bis(triphenylphospholanilidene)ammonium ions, etc.

Other examples of the organic cation are radical cations formed from electron donative neutral organic molecules. Examples of these electron donative compounds (neutral molecules) are as follows:

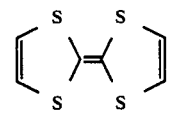
(Ig-1)

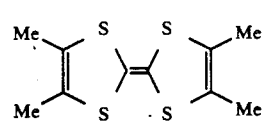
(Ig-2)

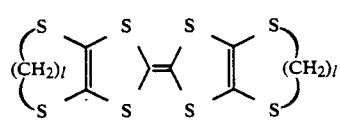
(Ig-3)

(l = 1, 2, 3, 4)

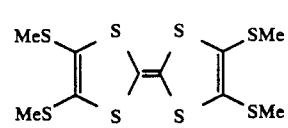
(Ig-4)

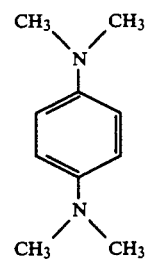
(Ig-5)

In the compounds represented by formulae (I) and (II) described above, the alkyl group represented by R is preferably an alkyl group having from 1 to 20 carbon atoms, such as methyl, ethyl, n-butyl, n-hexyl, n-octyl, n-dodecyl, and n-octadecyl.

Moreover, the alkyl group may be further substituted by cyano group, hydroxyl group, carboxyl group, sulfo group, a halogen atom (e.g., chlorine, bromine and fluorine), a straight chain or branched alkyl group (e.g., methyl, ethyl, propyl, butyl, hexyl, octyl, decyl, dodecyl, tetradecyl, hexadecyl, heptadecyl, octadecyl, and methoxyethoxyethyl), an aryl group (e.g., phenyl, tolyl, naphthyl, chlorophenyl, methoxyphenyl, and aceylphenyl), an alkoxy group (e.g., methoxy, ethoxy, butoxy, propoxy, and methoxyethoxy), an aryloxy group (e.g., phenoxy, tolyloxy, naphthoxy, and methoxyphenoxy), an alkoxycarbonyl group (e.g., methoxycarbonyl, butoxycarbonyl, and phenoxymethoxycarbonyl), an aryloxycarbonyl group (e.g., phenoxycarbonyl, tolyloxycarbonyl, and methoxyphenoxycarbonyl), an acyl group (e.g., formyl, acetyl, valeryl, stearoyl, benzoyl, toluoyl, naphthoyl, and p-methoxybenzoyl), an acyloxy group (e.g., acetoxy and acyloxy), an acylamino group (e.g., acetamido, benzamido, and methoxyacetamido), an anilino group (e.g, phenylamino, N-methylanilino, N-phenylanilino, and N-acetylanilino), an alkylamino group (e.g., n-butylamino, N,N-diethylamino, and 4-methoxy-n-butylamino), a carbamoyl group (e.g., n-butylcarbamoyl, N,N-diethylcarbamoyl, n-butylsulfamoyl, N,N-diethylsulfamoyl, n-dodecylsulfamoyl, and N-(4-methoxy-n-butyl)sulfamoyl), a sulfonylamino group (e.g., methylsulfonylamino, phenylsulfonylamino, and methoxymethylsulfonylamino), or a sulfonyl group (e.g., mesyl, tosyl, and methoxymethanesulfonyl).

The aryl group represented by R in formulae (I) and (II) described above is an aryl group having from 6 to 14 carbon atoms and is most preferably a phenyl group. In this case, the phenyl group may further be substituted by, for example, a methyl group, a methoxy group, a halogen atom, a nitro group, a cyano group, or a hydroxyl group.

The heterocyclic group represented by R is a 5-membered or 6-membered heterocyclic group containing at least one nitrogen atom, oxygen atom or sulfur atom in the ring, such as furyl, hydrofuryl, thienyl, pyrrolyl, pyrrolidyl, pyridyl, imidazolyl, pyrazolyl, quinolyl, indolyl, oxazolyl, and thiazolyl. Such a heterocyclic group may be further substituted by a nitro group, etc.

Two R's in the same ligand may combine with each other to form a ring and in this case, the ring is preferably a 5- to 8-membered ring. Also, such a ring may contain, therein another hetero atom such as an oxygen atom, a nitrogen atom, and a sulfur atom.

Furthermore, the aforesaid ring may be substituted by, for example, a halogen atom, an alkyl group, an alkoxy group, or an aryl group, or may be condensed with another ring.

The compounds shown by formulae (I) and (II) described above can be generally produced as follows.

A 1,3-dithiol-2-thione derivative is dissolved in absolute methanol, subjected to ring cleavage with a proper base and then converted into an alkali metal salt of a 1,2-ethylenedithiole derivative. A salt of a desired metal is added to the solution of the alkali metal salt followed by air oxidation. The precipitates which are formed are collected by filtration, dried, and extracted with an organic solvent such as dichloromethane, etc. The extract is concentrated and then methanol is gradually added to the concentrate, whereby crystals of the desired complex are precipitated.

Specific examples of the preferred compounds represented by formulae (I) and (II) described above are illustrated below. However, the compounds for use in this invention are not limited to these examples.

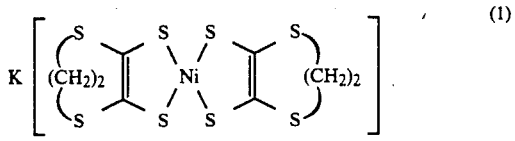

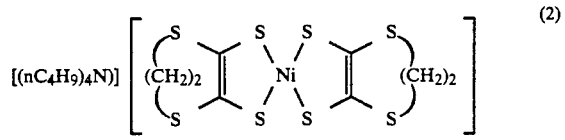

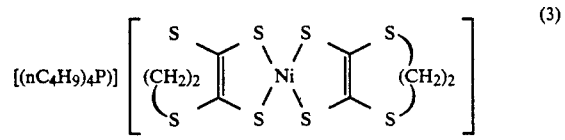

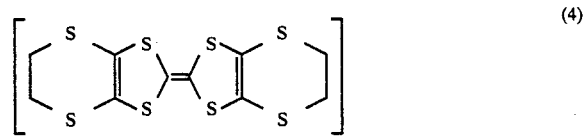

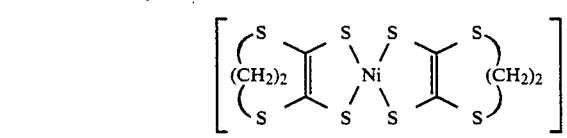

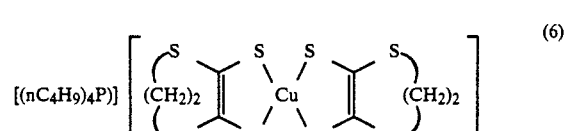

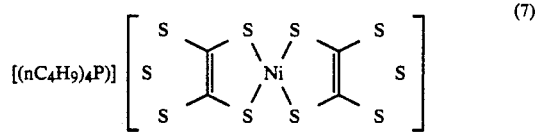

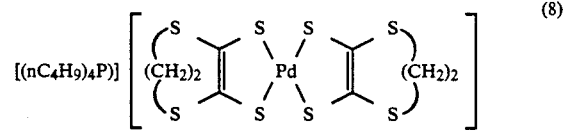

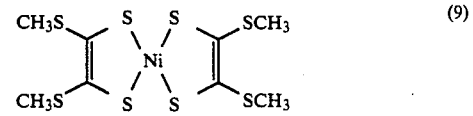

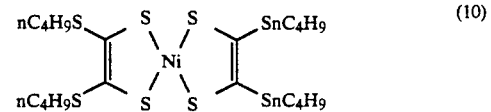

-continued
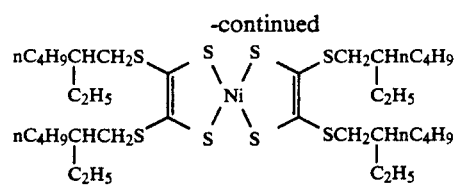 (11)
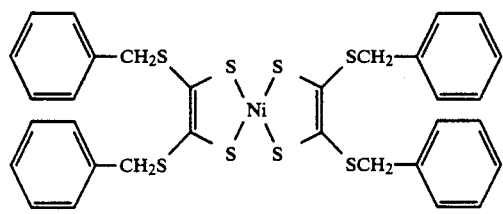 (12)
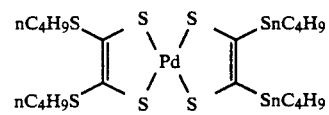 (13)
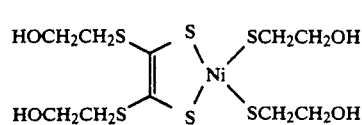 (14)
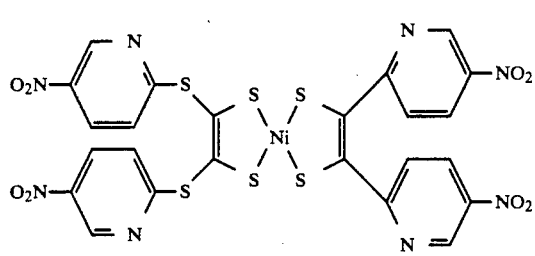 (15)
(16)
HOCH₂CH₂SSSCH₂CH₂OH
　　　　＼ ／ ＼
　　　　　Ni
　　　　／ ＼ ／
HOCH₂CH₂SSSCH₂CH₂OH
[((C₆H₅)₃P)₂N] (17)
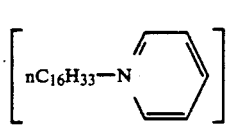 
[nC₁₆H₃₃—N⟨pyridine⟩] (18)
-continued
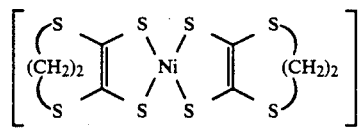 (19)
[(CH₃OCH₂CH₂)(C₆H₅)₃P] (20)
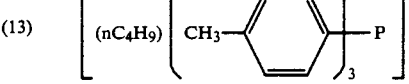
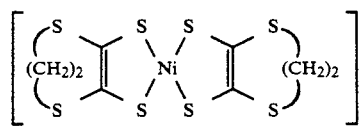 (21)
[(nC₄H₉){CH₃-C₆H₄-}₃P]
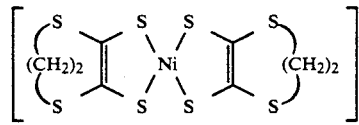 
[(C₆H₅CH₂(C₆H₅)₃P] (22)
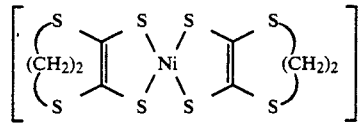
[(nC₄H₉SC₆H₄)(C₄H₉)₃P] (23)
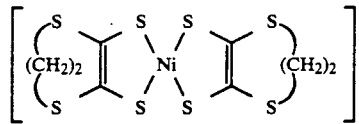
[(Br(CH₂)₃)(C₆H₅)₃P] (24)
[{C₂H₅O₂C(CH₂)₃}(C₆H₅)₃P] (25)
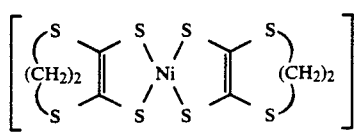
[(NC(CH₂)₃(C₆H₅)₃P] (26)
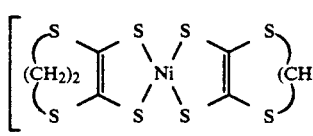
[(CH₃OC₆H₄(nC₄H₉)₃P] (27)

-continued

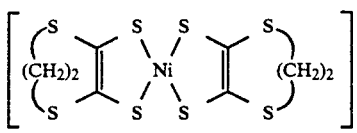

The metal complexes represented by aforesaid formulae (I) or (II), including the above-illustrated compounds, can be synthesized by the methods shown in the Synthesis Examples described hereinbelow or methods similar to these methods.

The infrared absorbent composition of this invention can comprise a compound represented by formulae (I) or (II) described above dispersed in a suitable binder. There is no particular restriction on the binder and any desired organic or inorganic binder capable of allowing the function of the infrared absorptive property of the compound contained therein to be exhibited may be used in this invention. Examples of suitable binders include high molecular weight materials such as plastics and inorganic materials such as glass, etc. A binder capable of forming a film having excellent transparency and mechanical properties is preferably used in this invention.

Representative examples of suitable film-forming binders include polyesters such as polyethylene terephthalate; cellulose esters such as cellulose diacetate, cellulose triacetate, and cellulose acetate butyrate; polyolefins such as polyethylene and polypropylene; polyvinyl compounds such as polyvinyl chloride, polyvinylidene chloride, a vinyl chloride-vinyl acetate copolymer, and polystyrene; acrylic addition polymers such as polymethyl methacrylate; polycarbonates composed of polycarbonic acid ester; phenol resins; urethane resins; and hydrophilic binders such as gelatin.

A film of the aforesaid plastic material containing the metal complex compound represented by formulae (I) or (II) described above is formed by the following methods.

In a first method, a compound of the aforesaid formulae is compounded in a plastic during the formation of the film. More specifically, a metal complex compound represented by formulae (I) or (II) is mixed with powder or pellets of the binder polymer together with, if necessary, various additives. The mixing of the ingredients is followed by melting and the molten mixture is extruded by a T-die method or an inflation method, or is formed into a film by a calender method in order to provide a film containing the aforesaid metal complex compound uniformly dispersed therein. Also, when forming the film using a polymer solution by a casting method, the metal complex compound of formulae (I) or (II) may be incorporated in the polymer solution.

In a second method, a polymer solution or dispersion containing the metal complex compound of formulae (I) or (II) is coated on the surface of a plastic film formed by a proper method or on the surface of a glass plate in order to form an infrared absorbing layer. A polymer capable of dissolving therein the metal complex compound of formulae (I) or (II) may be used as a binder polymer for the coating composition. This binder polymer should have excellent adhesion to a plastic film or a glass plate which may be used as the support. Examples of such a binder polymer include polymethyl methacrylate, cellulose acetate butyrate, and polycarbonate. In order to improve adhesion in this method, a subbing layer may be previously applied to the surface of the support.

In a third method, a mixture of a polymerizable monomer and a metal complex compound of formulae (I) or (II) is added with a proper polymerization initiator into a frame of a light incident window of an element which is cut for infrared rays. The monomer is then polymerized by the application of heat or light to form an infrared filter in the window frame by the polymer thus formed. In this method, the whole element may be covered by a plastic film which is formed using an addition polymerizable composition composed of an ethylenically unsaturated polymerizable monomer or an epoxy resin and the metal complex compound of formulae (I) or (II).

In a fourth method, a compound of formulae (I) or (II) is vapor-deposited on the surface of a proper support. Moreover, a proper layer of a film-forming binder may be formed on the vapor-deposited layer of the compound as a protective layer.

Furthermore, the near infrared absorbent for use in this invention can be utilized for color solid state image pickup elements in the following manner.

(1) After forming plural stripe-form or mosaic form color separation filter layers each having definite spectral characteristics on a semiconductor element, a surface protective layer containing the near infrared absorbent is formed on the filter layer or the near infrared absorbent is vapor-deposited on the surface of the filter layer.

(2) The near infrared absorbent of this invention may be used together with a visible light absorbing dye in the aforesaid color separation filter layer(s).

(3) The near infrared absorbent of this invention is incorporated in a transparent interlayer formed in multilayer color separation filters or in a surface smoothing layer on the color separation filter.

The optical filter formed using the infrared absorbent composition of this invention is more effectively used in a combination of the color separation filters for color solid state pickup elements as described in JP-A-57-58107, JP-A-59-9317, and JP-A 59-30509.

The infrared absorbent composition of this invention may contain two or more kinds of the compounds shown by formulae (I) and (II) described above. Also, the composition may further contain conventional organic or metal complex series near infrared absorbent(s). In particular, by containing a conventional near infrared absorbent having a different absorption maximum together with the infrared absorbent of this invention, the absorption wavelength region of the infrared absorbent composition of this invention can be widened.

In the infrared absorbent composition of this invention, an ultraviolet absorbent is effectively added thereto for further improving the light fastness thereof. Representative examples of suitable ultraviolet absorbents include substituted or unsubstituted benzoic acid esters such as resorcinol monobenzoate and methyl salicylate; cinnamic acid esters such as butyl 2-oxy-3-methoxycinnamate; benzophenones such as 2,4-dioxybenzophenone; $\alpha,\beta$-unsaturated ketones such as dibenzalacetone; coumarins such as 5,7-dioxycoumarin; carbostyryls such as 1,4-dimethyl-7-oxycarbonylstyryl; and azoles such as 2-phenylbenzimidazole and 2-(2-hydroxyphenyl)benzotriazole.

Furthermore, in the case of a film formed by coating the infrared absorbent composition of this invention, a thin plastic film can be formed on the surface of the coated film by coating or lamination. This coating or lamination protects the coated film layer or imparts suitable anti-stick quality to the coated film layer. For example, a polyvinyl chloride film of 0.05 mm in thickness is superposed on the coated layer followed by pressing and heating to 120° to 140° C. to form a surface film layer.

The proportion of the metal complex compound represented by formulae (I) or (II) in the infrared absorbent composition of this invention is from 0.1 to 50 parts by weight and preferably from 0.5 to 10 parts by weight per 100 parts by weight of a binder.

An optical filter obtained from the infrared absorbent composition of this invention may have a low transmittance of light of the wavelength region being intercepted to the extent of attaining the desired purpose thereof. In the case of using the composition of this invention, it is necessary that the amount of the binder added and the thickness of the filter be controlled such that the transmittance of light in the valley wavelength region of 600 nm or longer becomes not higher than 10%, preferably not higher than 2.0%, and more preferably not higher than 0.1%. A practical thickness of the filter is from 0.002 mm to 0.5 mm. However, according to the desired use, filters having other thicknesses than the aforesaid range can be designed.

According to the aforesaid embodiment of this invention, a near infrared absorbent composition having an absorption maximum wavelength of 600 nm or longer can be obtained.

Also, according to this invention, an optical filter having an excellent fastness to heat and light can be obtained at a low cost.

In addition, in the infrared absorbent composition of this invention, since the solubility in a solvent can be adjusted by properly choosing and combining cation species against complex ions of an infrared absorbent comprising a metal complex compound, there is an advantage that various binders can be widely employed.

The optical filter obtained using the infrared absorbent composition of this invention can be used as a safelight filter for infrared light sensitive materials, an infrared cut filter for controlling the growth of plants, for intercepting thermal radiation, and for cutting off light harmful to the human eye. The optical filter may also be used for an infrared cut filter for a light-receiving element for semiconductor devices and for a color solid state image pickup element, an infrared cut filter for an optoelectronic integrated circuit combined with an element having electric functions together with optical functions on a substrate as described above as well as various other uses.

Furthermore, the composition of this invention can be applied to uses other than the aforesaid optical filters based on the infrared absorption characteristics. For example, the composition of this invention can be utilized for an infrared absorbent paint. Also, by adding the composition to the ink of an ink jet printer in the manner described in JP-A-56-135568, the reading efficiency thereof of near infrared light can be improved. The composition can also be applied to a laser light recording/reading medium in the manner described in JP-A-57-11090.

Moreover, the composition of this invention can be utilized as an infrared ray/heat exchanging agent by utilizing the property thereof of converting absorbed near infrared light into heat. Typical examples are as follows:

(1) By adding the composition of this invention to a laser heat-sensitive recording material as described in JP-A-57-14095 or JP-A-57-14096, the mixed coloring reaction caused by heat generated by the irradiation of laser in the infrared region can be increased.

(2) The composition of this invention can be incorporated into a resist material for changing the solubility thereof by the action of heat based on laser light as described in JP-A 57 40256.

(3) By incorporating the compound of this invention into a heat drying or thermosetting composition as described in JP-A-56-143242, the reaction can be accelerated.

According to another embodiment of this invention, organic base materials having an absorption maximum in the wavelength region of from about 300 nm to about 2,000 nm can be stabilized to light by adding thereto the metal complex compound represented by formulae (I) or (II) described above.

The organic base materials for use in this invention include all the dyes classified by a dyeing property into water-soluble dyes such as basic dyes, acid dyes, direct dyes, soluble vat dyes, and mordant dyes; water-insoluble dyes such as sulfur dyes, vat dyes, oil-soluble dyes, disperse dyes, azoic dyes, and oxidation dyes; and reactive dyes. These organic base materials include not only dyes visible as colors under sunlight but also colorless or light-yellow fluorescent whitening dyes.

Preferably, quinoneimine dyes (such as azine dyes, oxazine dyes, and thiazine dyes), methine and polymethine dyes (such as cyanine dyes and azomethine dyes), azo dyes, anthraquinone dyes, indamine dyes, indophenol dyes, indigoid dyes, carbonium dyes, formazan dyes, and pyrazolazole dyes are used in this invention.

Also, the organic base materials used in this invention include high molecular weight compounds such as polyolefins, polyamides, polydienes, polyvinyl chloride, polyacrylic acid, polystyrene, polyvinyl alcohol, polyesters, polyethers, polyurethanes, polyacetals, polycarbonates, and polyphenylene oxide. Of these high molecular weight compounds, polyolefins, polydienes, and polystyrene are preferably used in this invention.

Furthermore, organic base materials used in this invention include image-forming dyes which are used in the filed of photography, such as the dyes formed from color couplers, DRR compounds, DRR couplers, amidrazone compounds, and dye developing agents, and dyes for a silver dye bleaching photographic process.

Preferred dyes to be used as the organic base materials in this invention are anthraquinone, quinoneimine, azomethine, polymethine, indamine, indophenol, formazan, and pyrazolazole dyes.

In this invention, the most preferred dyes are methine dyes, polymethine dyes, indamine dyes, indophenol dyes, and pyrazolazole dyes.

The methine dyes, polymethine dyes, indamine dyes, and indophenol dyes include the compounds having the following group:

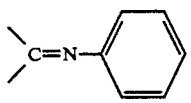

wherein the phenyl group is an unsubstituted phenyl group or a phenyl group substituted by an alkyl group, an alkoxy group, a halogen atom, or an amino group.

Dye-forming couplers suitable for use in this invention include yellow dye-forming couplers, magenta dye-forming couplers, and cyan dye-forming couplers. These couplers may be the so-called 4-equivalent type couplers or the 2-equivalent type couplers as described in U.S. Pat. Nos. 3,277,155 and 3,458,315.

The yellow dye-forming couplers which can be used in this invention generally contain at least one methylene group activated by a carbonyl group (e.g., an open chain ketomethylene group) and include β-diketones and β-ketoacylamides such as benzoylacetanilide and α-pivaloylacetanilide.

Specific examples of the yellow dye-forming couplers which can be used in this invention are described in U.S. Pat. Nos. 2,875,057, 3,265,506, 3,408,194, 3,551,155, 3,582,322, 3,725,072, and 3,891,445; West German Patent 1,547,868; West German Patent Application (OLS) Nos. 2,123,461, 2,219,917, 2,261,361, 2,263,875, and 2,414,006; British Patents 1,421,123, 1,421,126, and 1,425,020; JP-B-51-10783 (the term "JP-B" as used herein means an "examined published Japanese patent application"); JP-A-51-102636; JP-A-50-6341; JP A-50-123342; JP-A-50-130442; JP-A-51-21827; and JP-A-50-87650.

Suitable magenta dye-forming couplers include, for example, 5-pyrazolone type magenta couplers. Specific examples of the magneta dye-forming couplers which can be used in this invention are described in U.S. Pat. Nos. 2,600,788, 2,983,608, 3,062,653, 3,127,269, 3,311,476, 3,419,391, 3,519,429, 3,558,319, 3,582,322, 3,615,506, 3,834,908, 3,891,445, 3,725,067, and 4,540,654; West German Patent 1,810,464; West German Patent Application (OLS) Nos. 2,408,665, 2,417,945, 2,418,959, and 2,424,467; JP-B-40-6031; JP-B-51-45990; JP-A-50-159336; JP-A-52-42121; JP-A-49-74028; JP-A-50-60233; JP-A-51-26541; and JP-A-59-171956.

Other suitable magenta dye-forming couplers which can be used in this invention include indazolone couplers of the type described in Vittum and Weissberger, Journal of Photoqraphic Science, Vol. 6, pages 158 et seq. (1958), pyrazolinobenzimidazole couplers described in U.S. Pat. No. 3,061,432, pyrazole-s-triazine as described in Belgian Patent 724,427, and 2-cyanoacetylcoumarone couplers described in U.S. Pat. No. 2,115,394.

Representative cyan dye-forming couplers which can be used in this invention include phenolic cyan couplers and α-naphtholic cyan couplers. Specific examples of suitable cyan dye-forming couplers are described in U.S. Pat. Nos. 2,369,929, 2,434,272, 2,474,293, 2,521,908, 2,895,826, 3,034,892, 3,311,476, 3,458,315, 3,476,563, 3,583,971, 3,591,383, 3,767,411, and 4,004,929; West German Patent Application (OLS) Nos. 2,414,830 and 2,454,329; JP-A-48-59838; JP-A-51-26034; JP-A-48-5055; and JP-A-51-146828.

Other representative examples of the couplers which can be used in this invention are the colored couplers described in U.S. Pat. Nos. 3,476,560, 2,521,908, and 3,034,892, JP-B-44-2016, JP-B-38-22335, JP-B-42-11304, JP-B-44-32461, JP-A-51-26034, JP-A-52-42121, and West German Patent Application (OLS) No. 2,418,959; and the DIR couplers described in U.S. Pat. Nos. 3,227,554, 3,614,291, 3,701,783, 3,790,384, and 3,632,345, West German Patent Application (OLS) Nos. 2,414,006, 2,454,301, and 2,454,329, British Patent 953,454, JP-A-52-69624, JP-A-49-122335, and JP-B-51-16141.

General types of couplers which can be used in this invention are also described in Kirk-Othmer, Encyclopedia of Chemical Technology, Vol. 5, pages 822-825 and Glafkides, Photographic Chemistry, Vol. 2, pages 596-614.

When using the above-mentioned couplers to practice this invention, dyes are formed by the reaction of these couplers and the oxidized product of an aromatic primary amine silver halide developing agent. This developing agent includes aminophenols and phenylenediamines and, if desired, they may be used as a mixture thereof.

Typical developing agents which can form the organic basic materials in this invention by reacting with various couplers according to this invention are p-phenylenediamine and the derivatives thereof described in T. H. James, The Theory of the Photographic Process, 4th edition, pages 315-320, published by Macmillan, 1977. Preferably, the p-phenylenediamines contain at least one amino group which is substituted by a lower alkyl group having from 1 to 3 carbon atoms or a derivative thereof, such as 4-amino-N,N-dimethylaniline, 4-amino-N,N-diethylaniline, 4-amino-3-methyl-N,N-diethylaniline, 4-amino 3-methyl-N-ethyl-N-(β-methanesulfonamidoethyl)aniline, 4-amino-N-ethyl-N-(β-hydroxyethyl)aniline, and 4-amino-3-methyl-N-ethyl-N-(β-hydroxyethyl)aniline.

Preferred examples of the aforesaid couplers or other couplers which can form the organic base materials in this invention by causing a reaction with the oxidation product of a developing agent are those represented by following formulae (III), (IV), (V) and (VI):

Formula (III) is represented by the following formula:

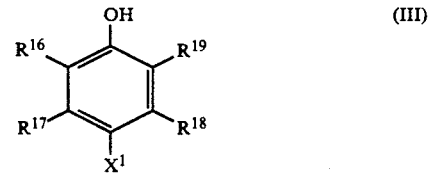

(III)

wherein $R^{16}$, $R^{17}$, $R^{18}$, and $R^{19}$ each represents hydrogen atom, a halogen atom (e.g., fluorine, chlorine, bromine, and iodine), an alkyl group (e.g., methyl, ethyl, octyl, dodecyl, tetradecyl, and octadecyl), a carbamoyl group (e.g., methylcarbamoyl, ethylcarbamoyl, dodecylcarbamoyl, tetradecylcarbamoyl, octadecylcarbamoyl, N-phenylcarbamoyl, and N-tolylcarbamqyl), a sulfamoyl group (e.g., methylsulfamoyl, ethylsulfamoyl, dodecylsulfamoyl, tetradecylsulfamoyl, octadecylsulfamoyl, N-phenylsulfamoyl, and N-tolylsulfamoyl), or an amido group (e.g., acetamido, propionamido, benzamido, phenacetamido, sulfonamido, phosphoric acid amido, and uredio). The $R^{16}$ and $R^{17}$ substituents may combine with each other to form a 6-membered ring (e.g., phenyl).

Moreover, in formula (III), $X^1$ represents hydrogen atom, a halogen atom (e.g., fluorine, chlorine, bromine, and iodine), or a group capable of splitting off by causing a reaction with the oxidation product of a developing agent (e.g., alkoxy, aryloxy, sulfonamido, sulfonyl, carbamoyl, imido, aminosulfonyl, alkylcarbonyloxy, arylcarbonyloxy, alkylthio, arylthio, and heterocyclic thio groups).

Also, the alkyl group, the carbamoyl group and the sulfamoyl group represented by $R^{16}$, $R^{17}$, $R^{18}$, or $R^{19}$ or the 6-membered ring formed by the combination of $R^{16}$ and $R^{17}$ may be substituted by other substituents such as an alkyl group (e.g., methyl, ethyl, propyl, octyl, dodecyl, tetradecyl, and octadecyl), an aryl group (e.g., phenyl, tolyl, and naphthyl), an aryloxy group (e.g., phenoxy and 2,5-di-(t)amylphenoxy), and a halogen atom (e.g., chlorine, bromine, and fluorine).

Formula (IV) is represented by the following formula:

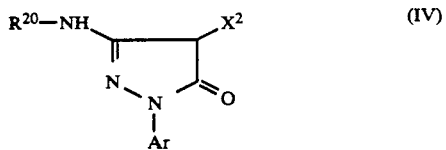

(IV)

wherein $R^{20}$ represents an alkyl group, an aryl group, an acyl group, or a carbamoyl group; Ar represents phenyl group or a phenyl group substituted by at least one halogen atom, alkyl group, cyano group, alkoxy group, alkoxycarbonyl group, or acylamino group; and $X^2$ represents hydrogen atom or a group capable of splitting off by the reaction with the oxidation product of an aromatic primary amine color developing agent.

Furthermore, in formula (IV) described above, the alkyl group represented by $R^{20}$ is an alkyl group having from 1 to 42 carbon atoms, such as methyl, butyl, octadecyl, and 2-(2,4-di-tert-amylphenoxy)ethyl. Suitable examples of the aryl group represented by $R^{20}$ include phenyl, 2-chlorophenyl, 2-chloro-5-tetradecanephenyl, 2-chloro-5-(3-octadecenyl-N-succinimido)phenyl, 2,4-dichloro-5-dodecyloxyphenyl, and 2-chloro-5-octadecylthiophenyl. Suitable examples of the acyl group represented by $R^{20}$ include acetyl, 2-ethylhexanoyl, α-(2,4-di-tert-pentylphenoxy)acetyl, α-(2,4-di-tert-pentylphenoxy)butanoyl, γ-(2,4-di-tert-pentyl)butanoyl, and α-(3-pentadecylphenoxy)butanoyl. Also, suitable examples of the carbamoyl group represented by $R^{20}$ include N-methylcarbamoyl, N,N-dimethylcarbamoyl, N-hexadecylcarbamoyl, N-methyl-N-phenylcarbamoyl, and N-{3-[α-(2,4-di-tert-pentylphenoxy)-butylamido]}phenyl.

Moreover, in formula (IV), Ar represents phenyl group or a substituted phenyl group (e.g., 2,4,6-trichlorophenyl, 2,5-dichlorophenyl, 2,4-dimethyl-6-methoxyphenyl, 2,6 dichloro-4-methoxyphenyl, 2,6-dichloro-4-ethoxycarbonylphenyl, 2,6-dichloro-4-cyanophenyl, and 4-(α-(2,4-di-tert-amylphenoxy)-butylamido)phenyl).

Also, in formula (IV), $X^2$ represents hydrogen atom or a coupling splitt-off group, examples of which include a halogen atom (e.g., fluorine, chlorine, and bromine), an alkoxy group (e.g., dodecyloxy, dodecyloxycarbonylmethoxy, methoxycarbamoylmethoxy, carboxypropyloxy, and methanesulfonyloxy), an aryloxy group (e.g., 4-methylphenoxy, 4-tert-butylphenoxy, 4-methoxyphenoxy, 4-methanesulfonylphenoxy, and 4-(4-benzyloxyphenylsulfonyl)phenoxy), an acyloxy group (e.g., acetoxy, tetradecanoyloxy, and benzoyloxy), a sulfonyloxy group (e.g., methanesulfonyloxy and toluenesulfonyloxy), an amido group (e.g., dichloroacetylamino, methanesulfonylamino, and triphenylphosphonamido), an alkoxycarbonyloxy group (e.g., ethoxycarbonyloxy and benzyloxycarbonyloxy), an aryloxycarbonyl oxy group (e.g., phenoxycarbonyloxy), an aliphatic or aromatic thio group (e.g., phenylthio, dodecylthio, benzylthio, 2-butoxy-5-tert-octylphenylthio, 2,5 -dioctyloxyphenylthio, 2-(2 ethoxyethoxy)-5-tert-octylphenylthio, and tetrazolylthio), an imido group (e.g., succinimido, hydantoinyl, 2,4-dioxooxazolidin-3-yl, and 3-benzyl-4-ethoxyhydantoin-1-yl), an N-heterocyclic ring (e.g., 1-pyrazolyl, 1-benzotriazolyl, and 5-chloro-1,2,4-triazol-b 1-yl), and an aromatic azo group (e.g., phenylazo). These split off groups may contain a photographically useful group.

The compound of formula (IV) may form a dimer or a higher polymer at $R^{20}$, Ar or $X^2$.

Formula (V) is represented by the following formula:

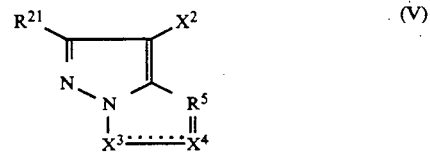

(V)

wherein $R^{21}$ represents hydrogen atom or a substituent; $X^2$ represents hydrogen atom or a group capable of splitting off by a reaction with the oxidation product of an aromatic primary amine color developing agent; and $X^3$, $X^4$ and $X^5$ each represents

—N=, or —NH=; at least one one the bonds $X^5$—$X^4$ and $X^3$—$X^4$ is a double bond and the other is a single bond, and when $X^3$—$X^4$ is a carbon-carbon double bond, it may be a part of an aromatic ring.

More specifically, $R^{21}$ in formula (V) represents a hydrogen atom, a halogen atom, an alkyl group, an aryl group, a heterocyclic group, cyano group, an alkoxy group, an aryloxy group, a heterocyclic oxy group, an acyloxy group, a carbamoyloxy group, a silyloxy group, a sulfonyloxy group, an acylamino group, an anilino group, a ureido group, an imido group, a sulfamoylamino group, a carbamoylamino group, an alkylthio group, an arylthio group, a heterocyclic thio group, an alkoxycarbonylamino group, an aryloxycarbonylamino group, a sulfonamido group, a carbamoyl group, an acyl group, a sulfamoyl group, a sulfonyl group, a sulfinyl group, an alkoxycarbonyl group, or an aryloxycarbonyl group.

These substituents (or groups) are described in more detail hereinbelow. That is, $R^{21}$ represents a hydrogen atom, a halogen atom (e.g., chlorine and bromine), an alkyl group (e.g., methyl, propyl, t-butyl, trifluoromethyl, tridecyl, 3-(2,4-di-t-amylphenoxy)propyl, allyl, 2-dodecyloxyethyl, 3-phenoxypropyl, 2-hexylsulfonylethyl, cyclopentyl, and benzyl), an aryl group (e.g., phenyl, 4-t-butylphenyl, 2,4-di-t-amylphenyl, and 4-tetradecanamidophenyl), a heterocyclic group (e.g., 2-furyl, 2-thienyl, 2-pyrimidinyl, and 2-benzothiazolyl), cyano group, an alkoxy group (e.g., methoxy, ethoxy, 2-methoxyethoxy, 2-dodecyloxyethoxy, and 2-methanesulfonylethoxy), an aryloxy group (e.g., phenoxy, 2-methylphenoxy, and 4-t-butylphenoxy), a heterocyclic oxy group (e.g., 2-benzimidazolyloxy), an acyloxy group (e.g., acetoxy and hexadecanoyloxy), a carbamoyloxy group (e.g., N-phenylcarbamoyloxy and N-ethylcarbamoyloxy), a silyloxy group (e.g., trimethylsilyloxy), a sulfonyloxy group (e.g., dodecylsulfonyloxy), an acylamino group (e.g., acetamido, benzamido, tetradecanamido, α-(2,4-di-t-amylphenoxy)butylamido, γ-(3-t-butyl-butyl-4-hydroxyphenoxy)butylamido, and α-{4-(4-hydroxyphenylsulfonyl)phenoxy}decanamido), an anilino group (e.g., phenylamino, 2-chloroanilino, 2-chloro-5-tetradecanamidoanilino, 2-chloro-5-dodecyloxycarbonylanilino, N-acetylanilino, and 2-chloro-5-{α-(3-t-butyl-4-hydroxyphenoxy)dodecanamido}anilino), a ureido group (e.g., phenylureido, methylureido, and N,N-dibutylureido), an imido group (e.g., N-succinimido, 3-benzylhydantoinyl, and 4-(2-ethylhexanoylamino)phthalimido), a sulfamoylamino group (e.g., N,N-dipropylsulfamoylamino and N-methyl-N-decylsulfamoylamino), a carbamoylamino group (e.g., phenylcarbamoylamino, methylcarbamoylamino, and N,N-dibutylcarbamoylamino), an alkylthio group (e.g., methylthio, octylthio, tetradecylthio, 2-phenoxyethylthio, 3-phenoxypropylthio, and 3-(4-t-butylphenoxy)propylthio), an arylthio group (e.g., phenylthio, 2-butoxy-5-t-octylphenylthio, 3-pentadecylphenylthio, 2-carboxyphenylthio, and 4-tetradecanamidophenylthio), a heterocyclic thio group (e.g., 2-benzothiazolylthio), an alkoxycarbonylamino group (e.g., methoxycarbonylamino and tetradecyloxycarbonylamino), an aryloxycarbonylamino group (e.g., phenoxycarbonylamino, 2,4-di-tertbutylphenoxycarbonylamino), a sulfonamido group (e.g., methanesulfonamido, hexadecanesulfonamido, benzenesulfonamido, p-toluenesulfonamido, octadecanesulfonamido, and 2-methyloxy-5-t-butylbenzenesulfonamido), a carbamoyl group (e.g., N-ethylcarbamoyl, N,N-dibutylcarbamoyl, N-(2-dodecyloxyethyl)carbamoyl, N-methyl-N-dodecylcarbamoyl, and N-{3-(2,4-di-tert-amylphenoxy)propyl}carbamoyl), an acyl group (e.g., acetyl, (2,4-di-tert-amylphenoxy)acetyl, and benzoyl), a sulfamoyl group (e.g., N- ethylsulfamoyl, N,N-dipropylsulfamoyl, N-(2-dodecyloxyethyl)sulfamoyl, N-ethyl-N-dodecylsulfamoyl, and N,N-diethylsulfamoyl), a sulfonyl group (e.g., methanesulfonyl, octanesulfonyl, benzenesulfonyl, toluenesulfonyl, and 2-butoxy-5-tert-octylphenylsulfonyl), a sulfinyl group (e.g., octanesulfinyl, dodecylsulfinyl, and phenylsulfinyl), an alkoxycarbonyl group (e.g., methoxycarbonyl, butyloxycarbonyl, dodecylcarbonyl, and octadecylcarbonyl), or an aryloxycarbonyl group (e.g., phenyl oxycarbonyl and 3-pentadecyloxycarbonyl).

$X^2$ in formula (V) represents a hydrogen atom or a group capable of splitting off by causing a reaction with the oxidation product of an aromatic primary amine color developing agent. Details of the split-off groups shown by $X^2$ are the same as those described above for formula (IV).

The compound of formula (V) may form a dimer or a higher polymer at $R^2$ or $X^2$.

Formula (VI) is represented by the following formula:

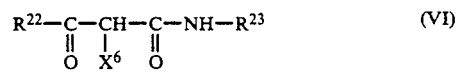

wherein Rhu 22 represents an alkyl group (e.g., methyl, ethyl, t-butyl and t-octyl) or an aryl group (e.g., phenyl); $R^{23}$ represents an aryl group (e.g., phenyl); and $X^6$ represents hydrogen atom, a halogen atom (e.g., chlorine and bromine), or a group capable of splitting off by causing a reaction with the oxidation product of an aromatic primary amine color developing agent (e.g., a heterocyclic nucleus such as naphthimido, succinimido, 5,5-dimethylhydantoinyl, 2,4-oxazolidinedione, imido, pyridone, and pyridazone, an acyloxy group, a sulfonyloxy group, an aryloxy group, and a urethane group).

The alkyl group or the aryl group represented by $R^{22}$ or the aryl group represented by $R^{23}$ may be substituted by a substituent such as an alkyl group, an aryl group, an alkoxy group, an aryloxy group, an amido group, an N-alkylcarbamoyl group, an N-alkylsulfamoyl group, an acyloxy group, a carboxy group, a sulfo group, a sulfonamido group, and a halogen atom.

Specific examples of the organic basic materials, in particular, couplers capable of forming organic dyes for use in this invention, are illustrated below.

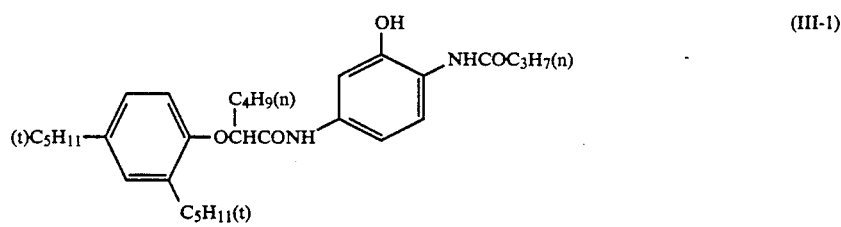

(III-1)

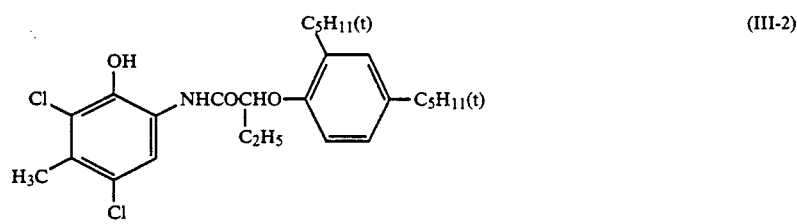

(III-2)

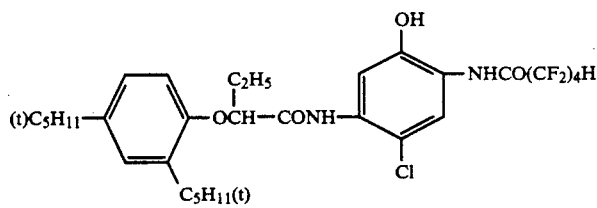
(III-3)
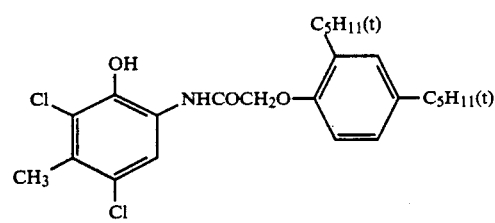
(III-4)
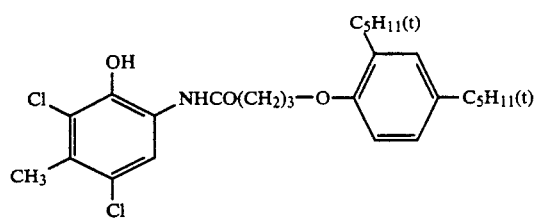
(III-5)
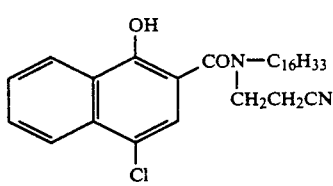
(III-6)
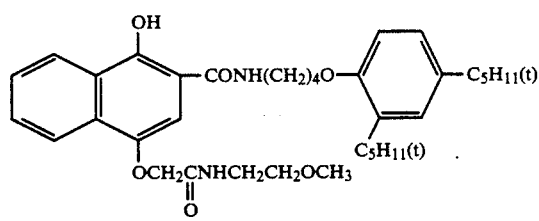
(III-7)
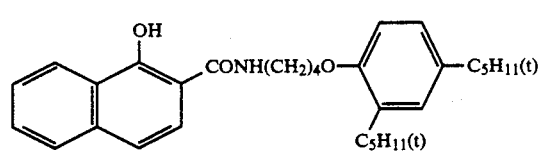
(III-8)
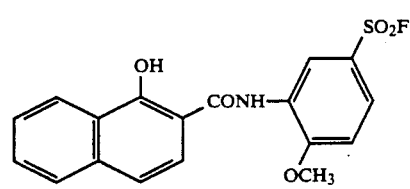
(III-9)

-continued
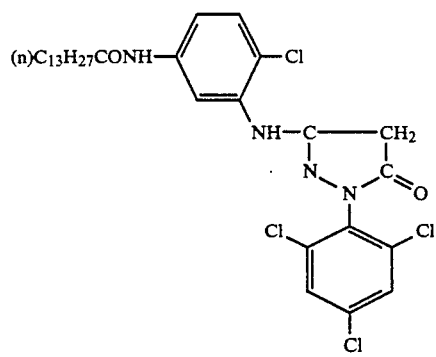
(IV-1)
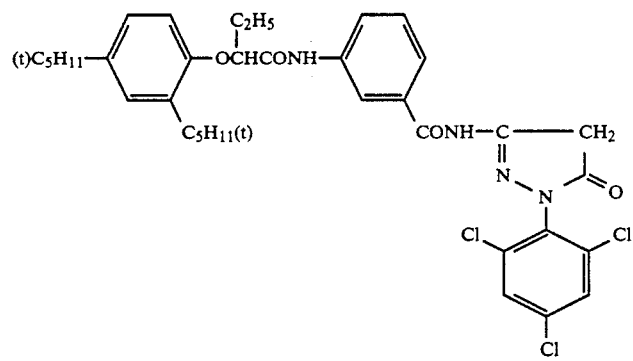
(IV-2)
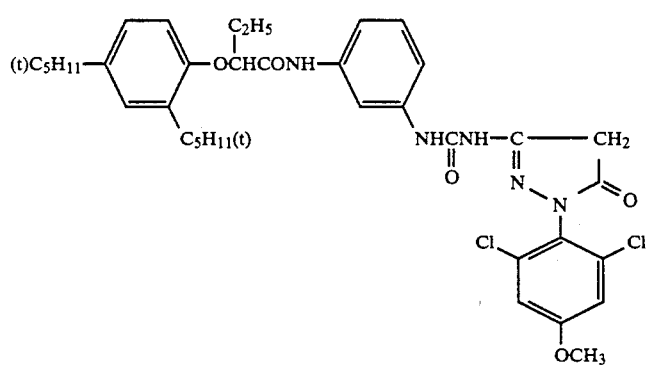
(IV-3)
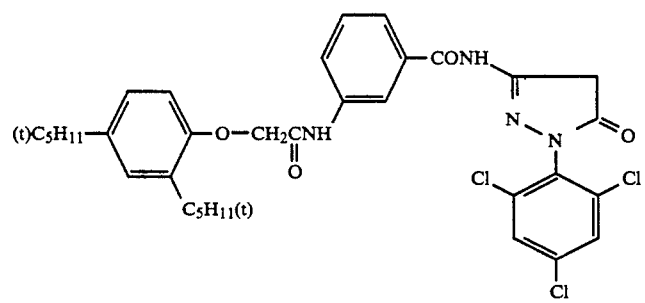
(IV-4)
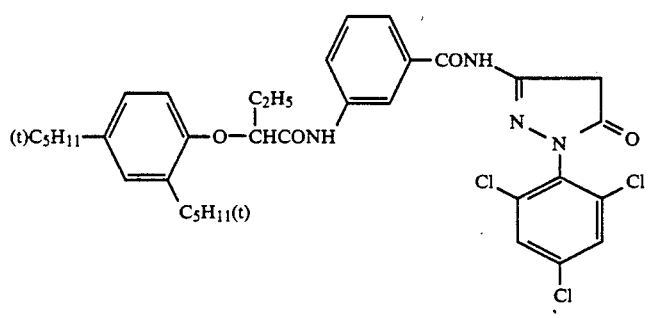
(IV-5)

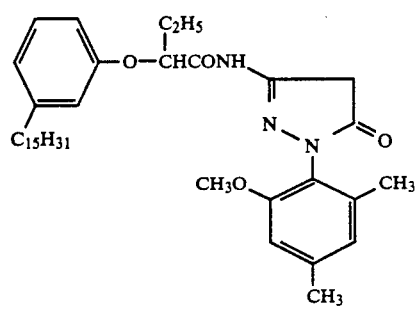
(IV-6)
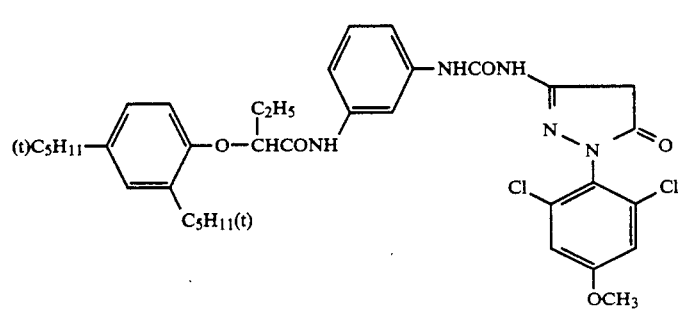
(IV-7)
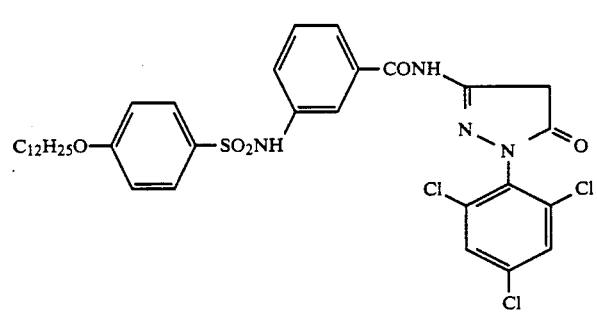
(IV-8)
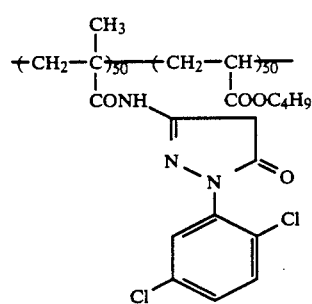
(IV-9)
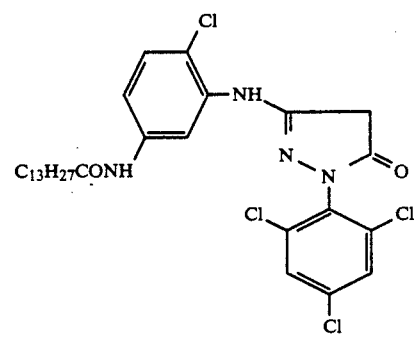
(IV-10)

-continued
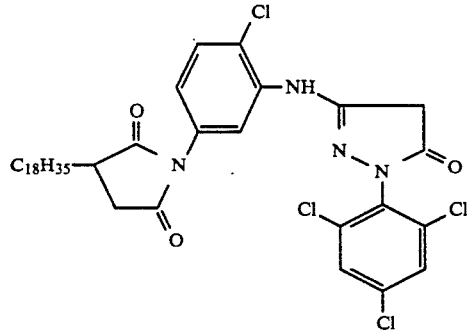
(IV-11)
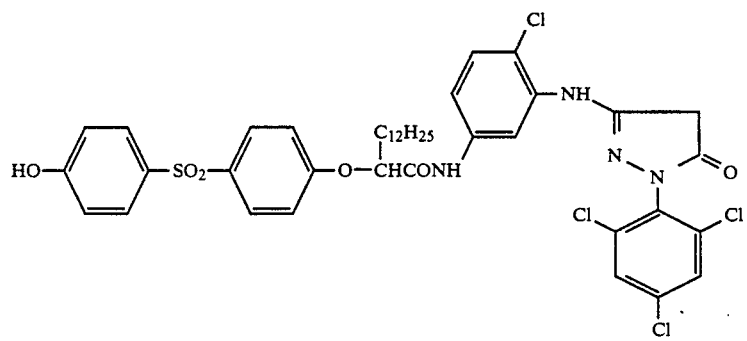
(IV-12)
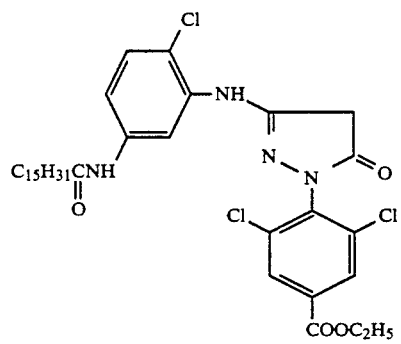
(IV-13)
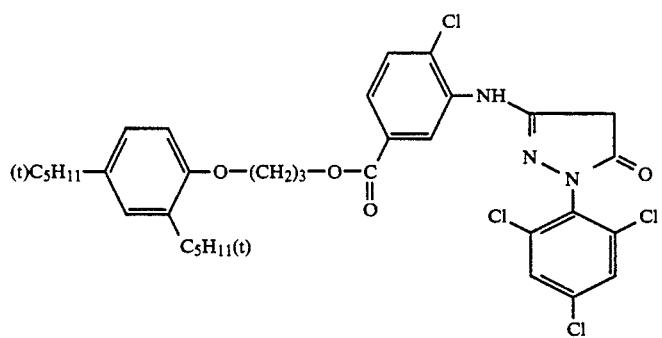
(IV-14)
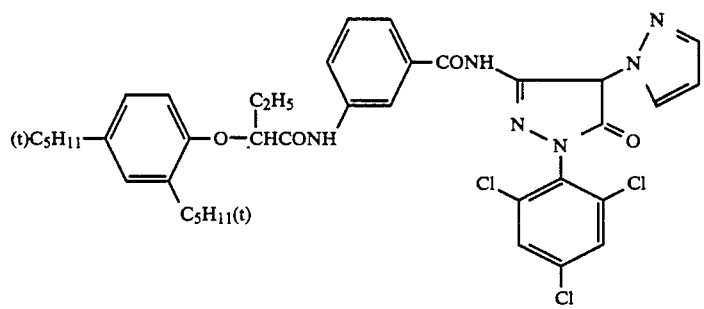
(IV-15)

-continued
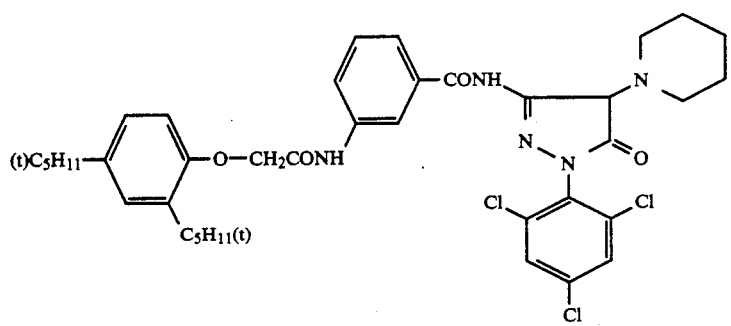
(IV-16)
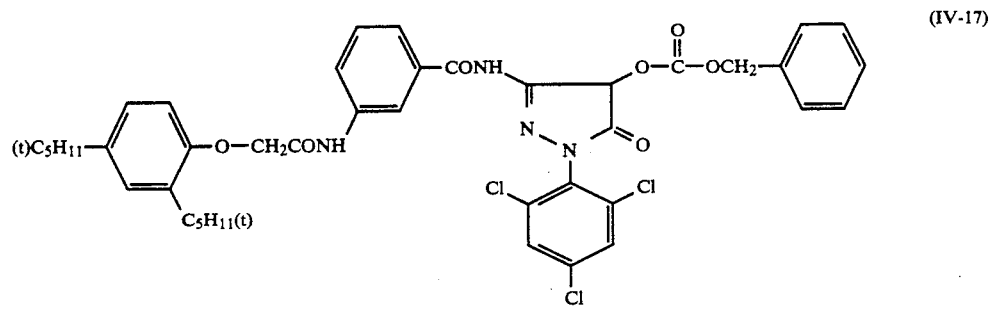
(IV-17)
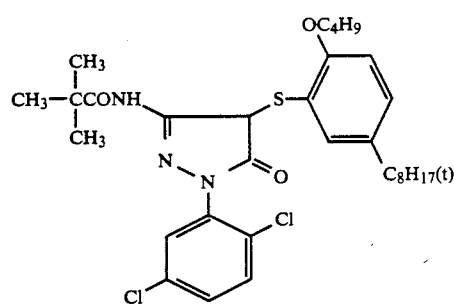
(IV-18)
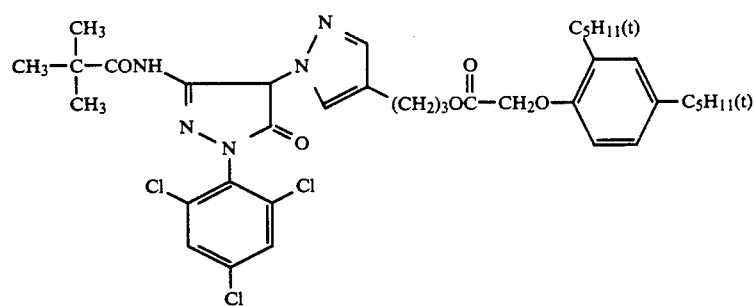
(IV-19)
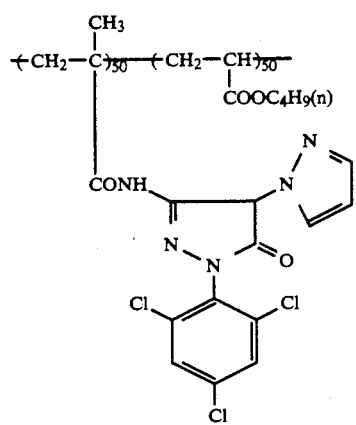
(IV-20)

-continued
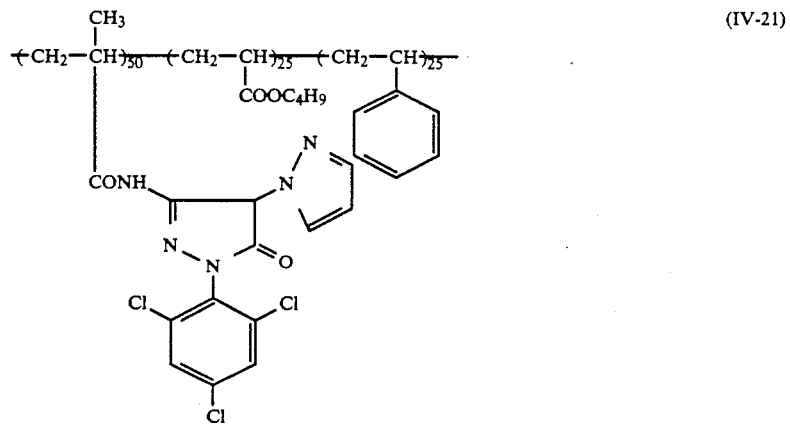
(IV-21)
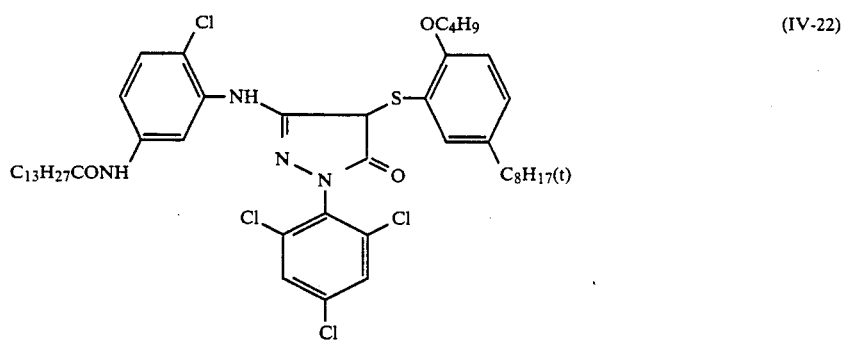
(IV-22)
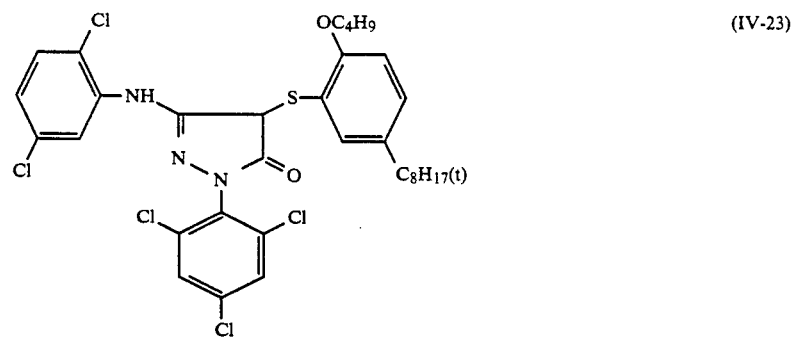
(IV-23)
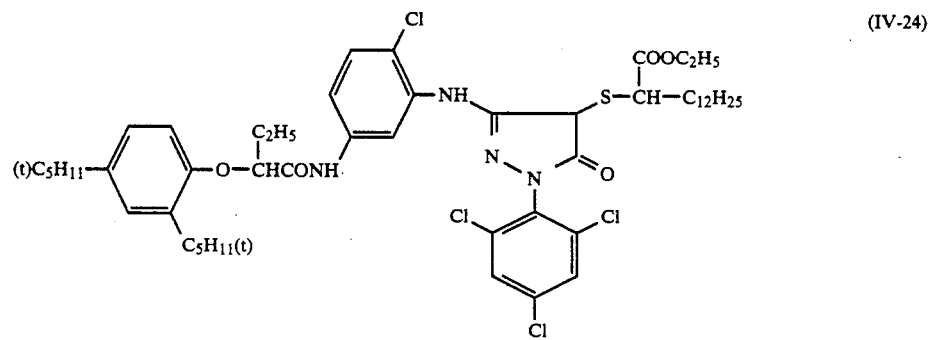
(IV-24)

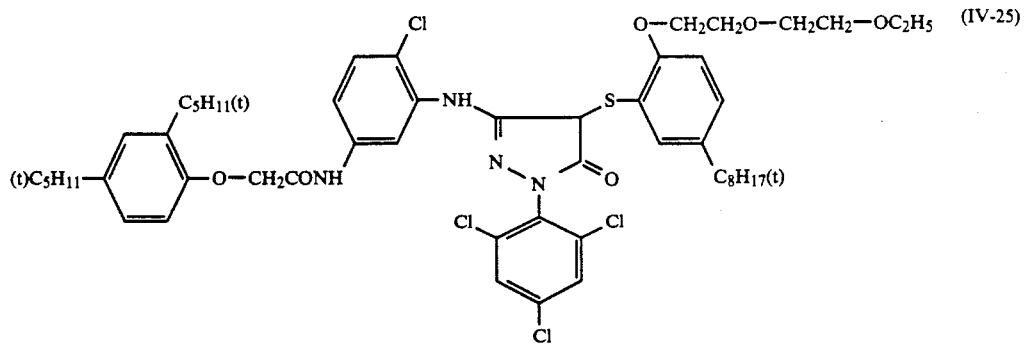
(IV-25)
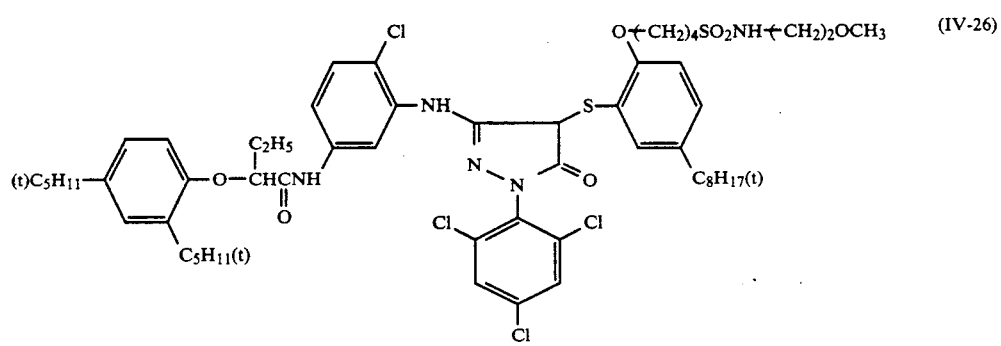
(IV-26)
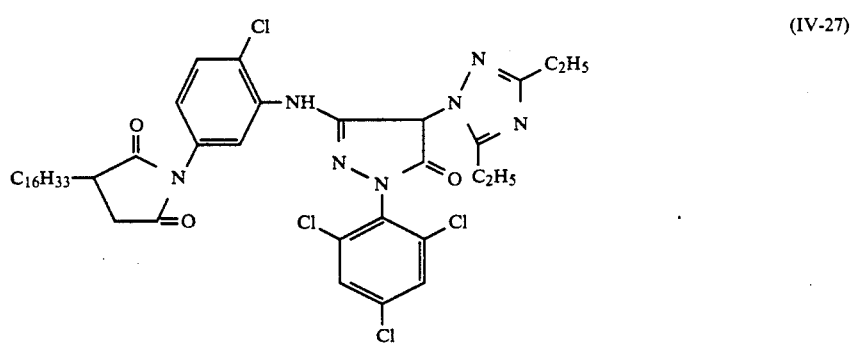
(IV-27)
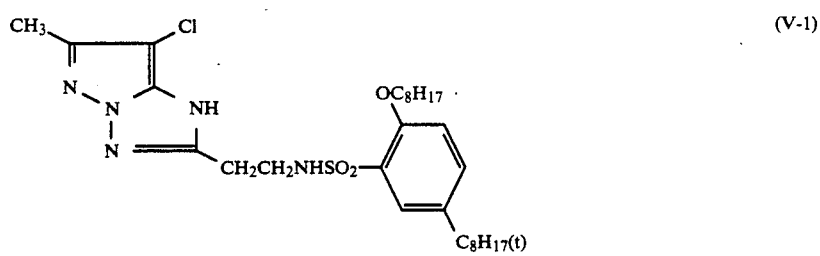
(V-1)
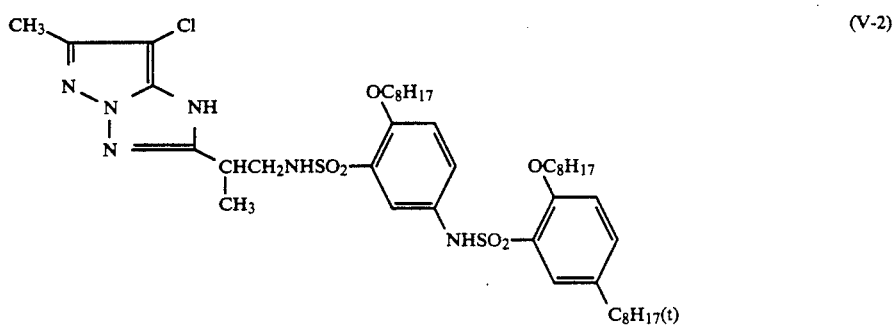
(V-2)

(V-3)
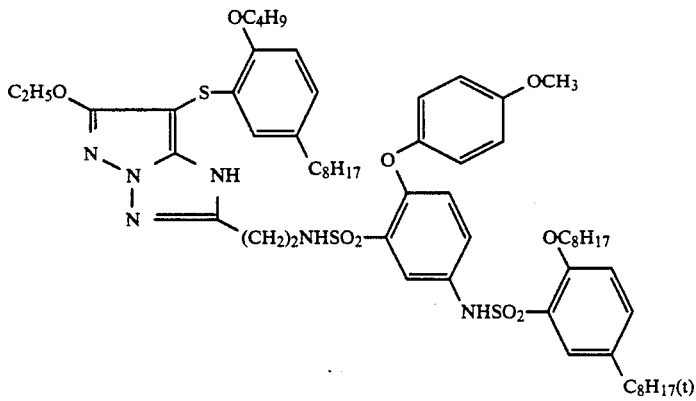
(V-4)
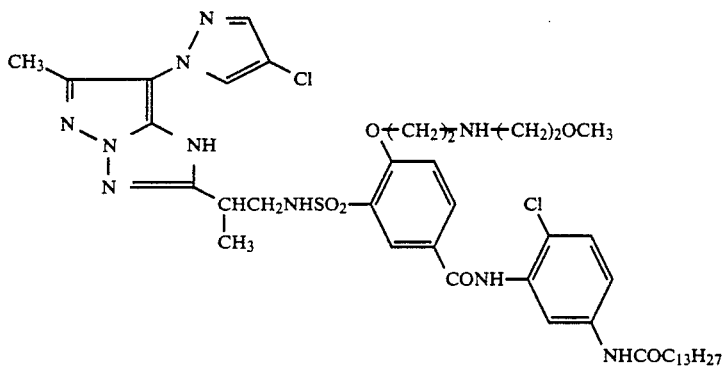
(V-5)
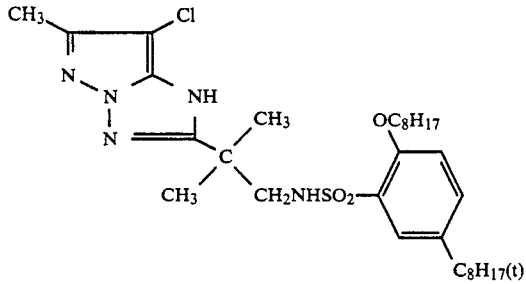
(V-6)
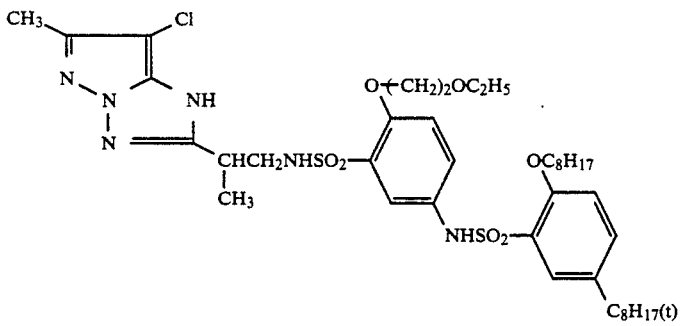
(V-7)
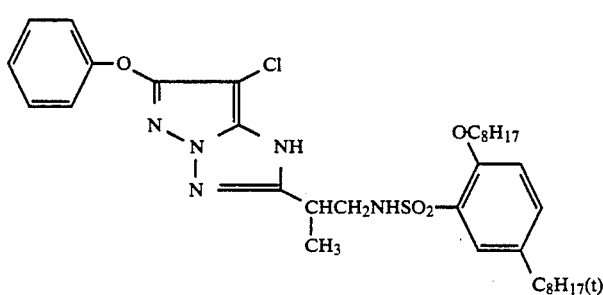

-continued
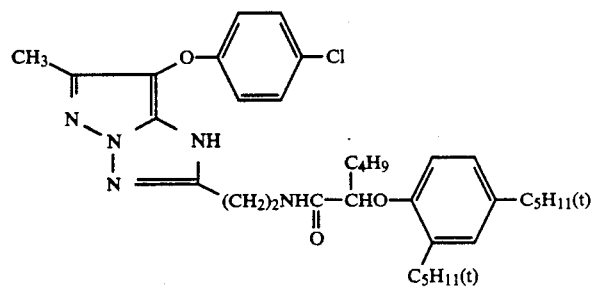
(V-8)
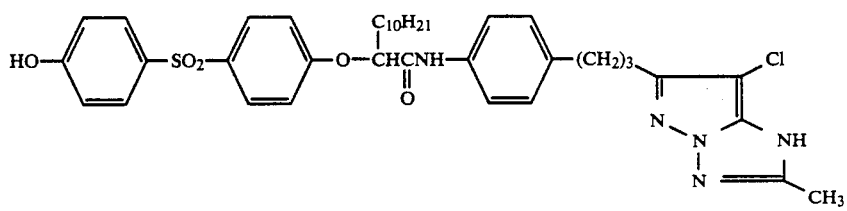
(V-9)
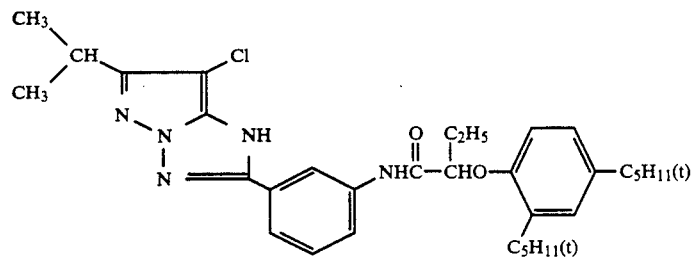
(V-10)
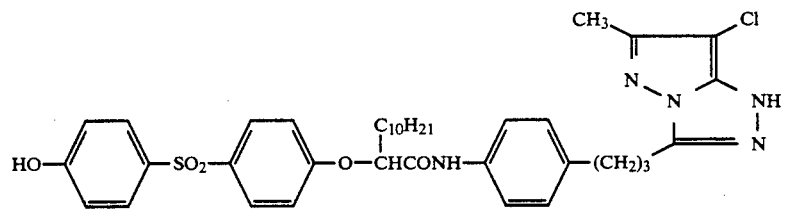
(V-11)
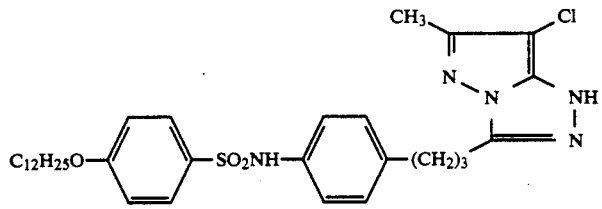
(V-12)
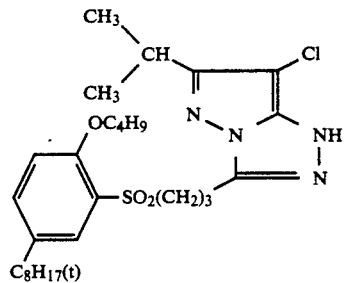
(V-13)

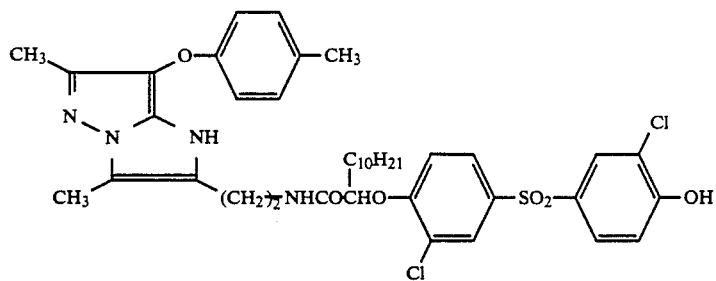 (V-14)
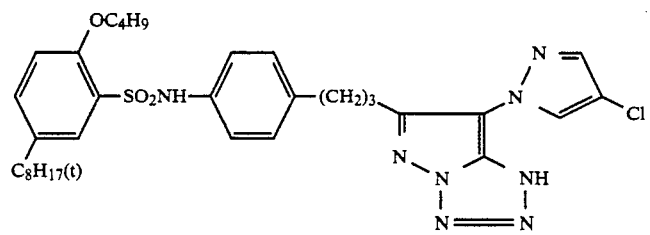 (V-15)
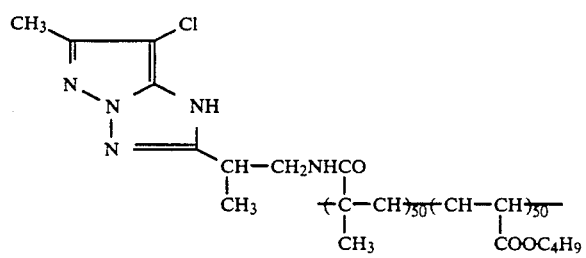 (V-16)
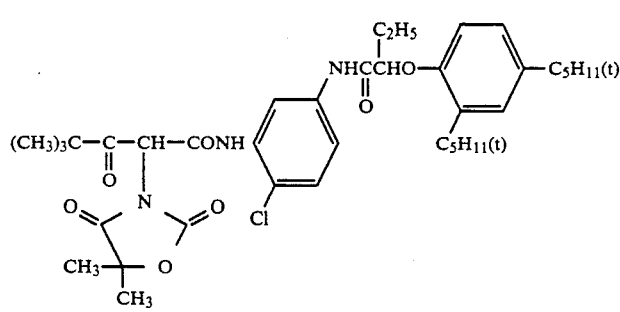 (VI-1)
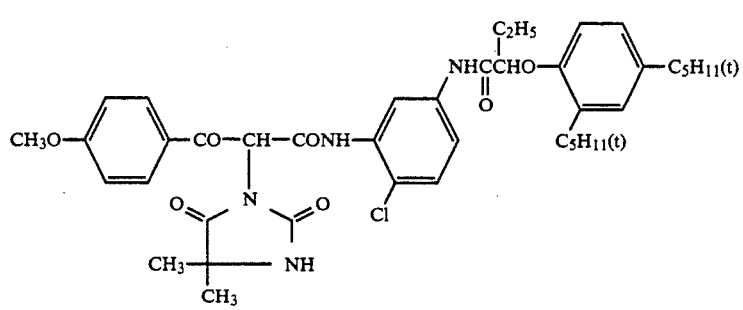 (VI-2)
Examples of other dyes which can be used as the organic base materials with the metal complex compound of formulae (I) or (II) of this invention are shown below.

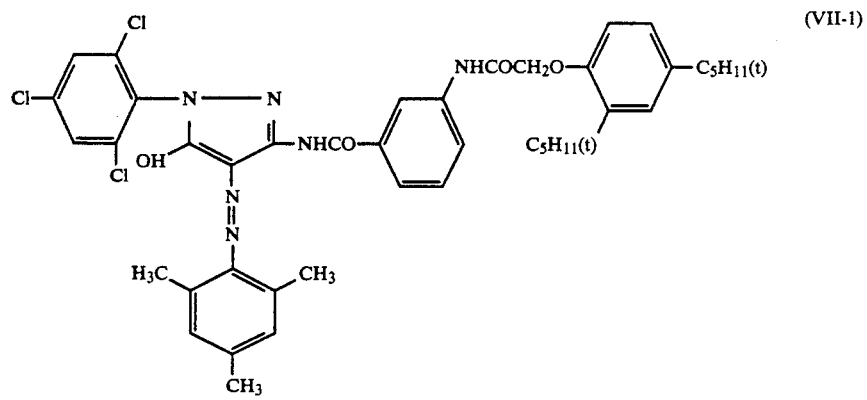
(VII-1)
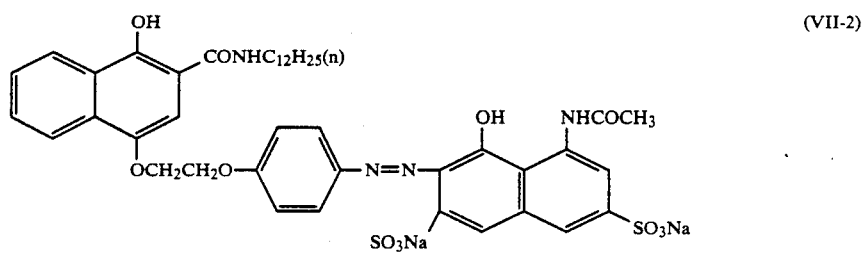
(VII-2)
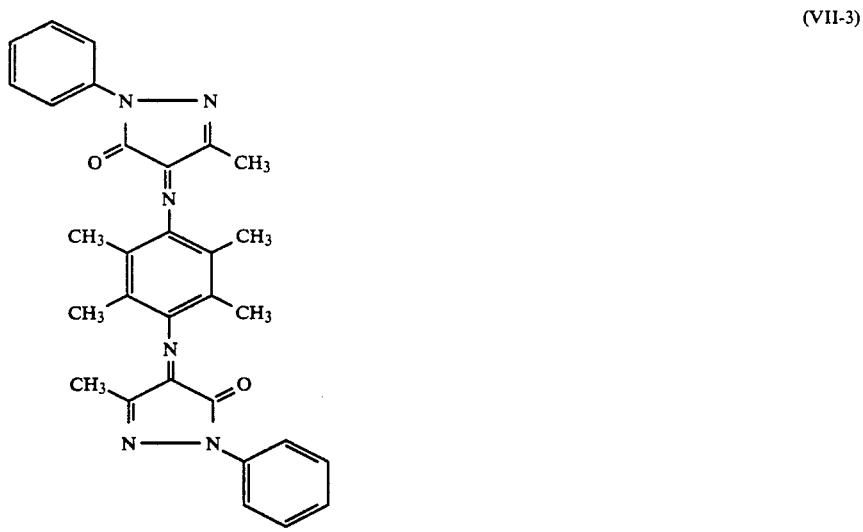
(VII-3)
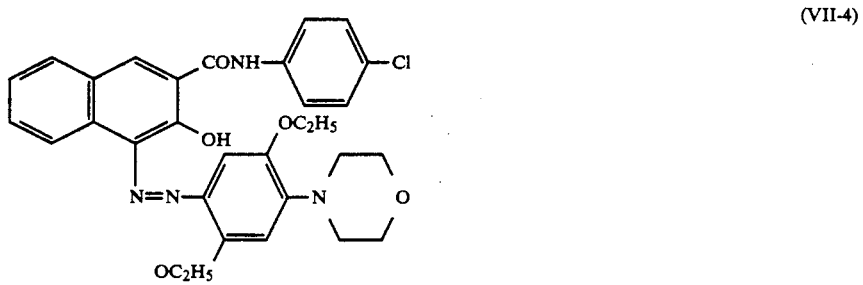
(VII-4)

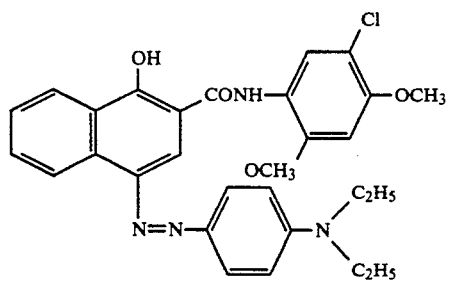
(VII-5)
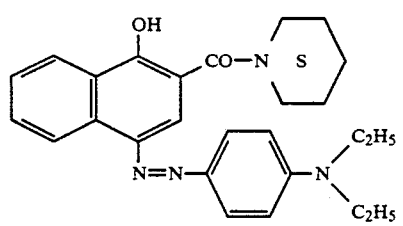
(VII-6)
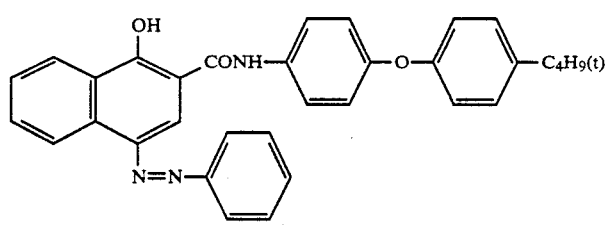
(VII-7)
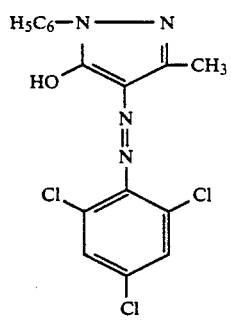
(VII-8)
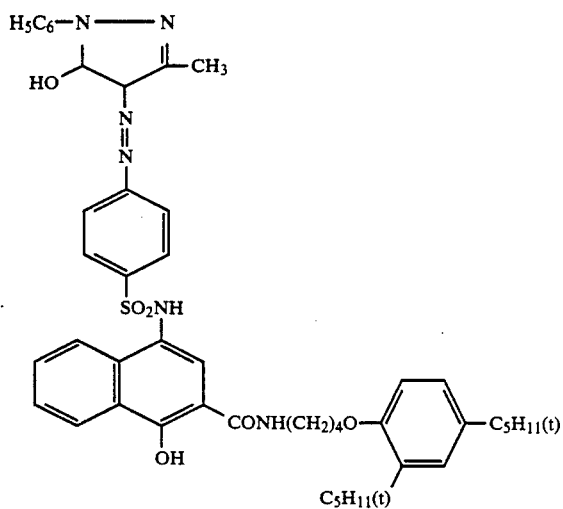
(VII-9)

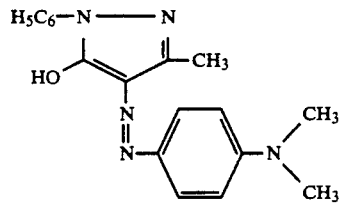 (VII-10)
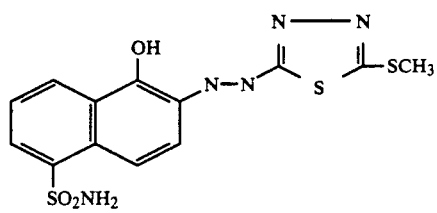 (VII-11)
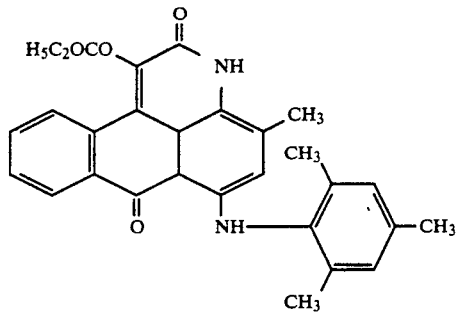 (VII-12)
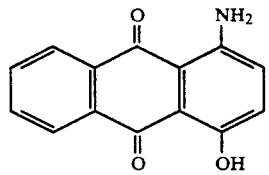 (VII-13)
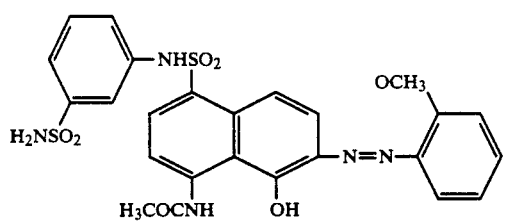 (VII-14)
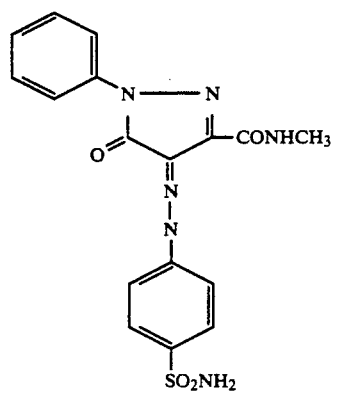 (VII-15)

-continued
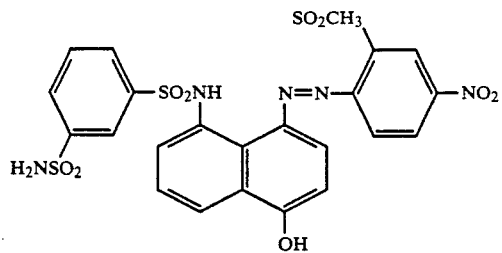 (VII-16)
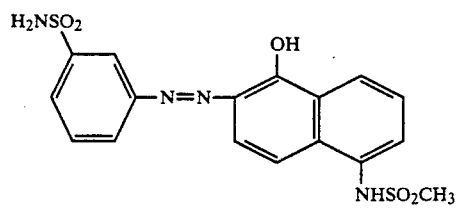 (VII-17)
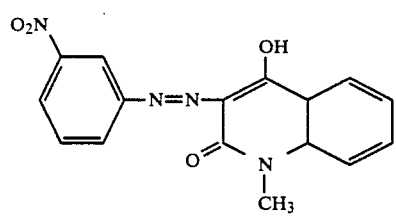 (VII-18)
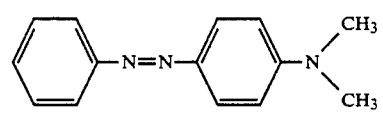 (VII-19)
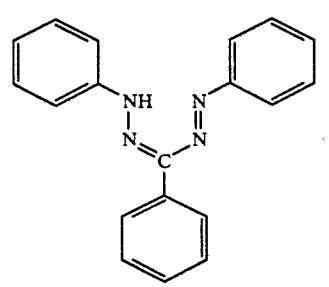 (VII-20)
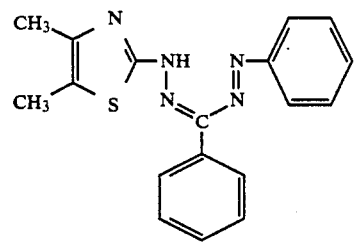 (VII-21)
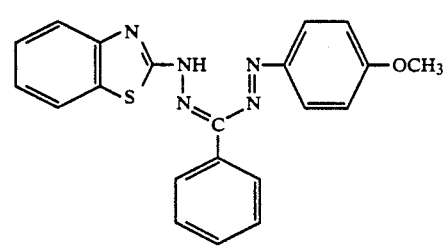 (VII-22)

-continued
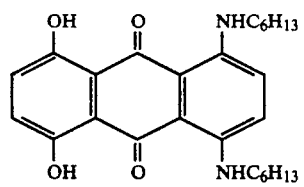 (VII-23)
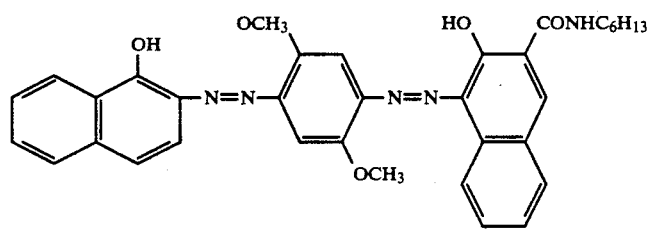 (VII-24)
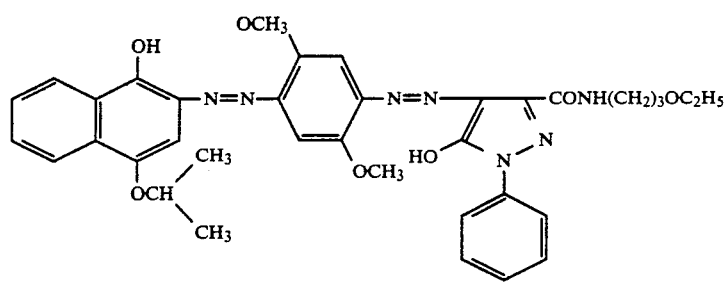 (VII-25)
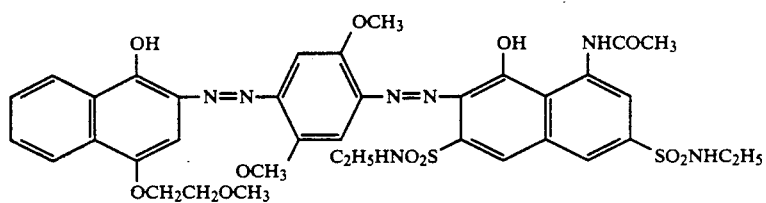 (VII-26)
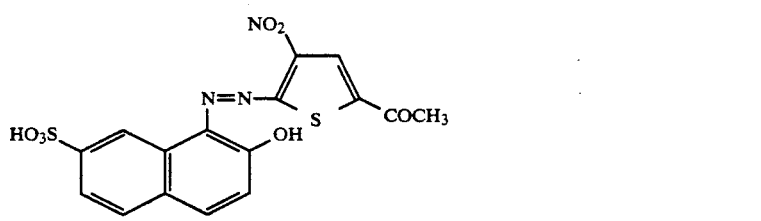 (VII-27)
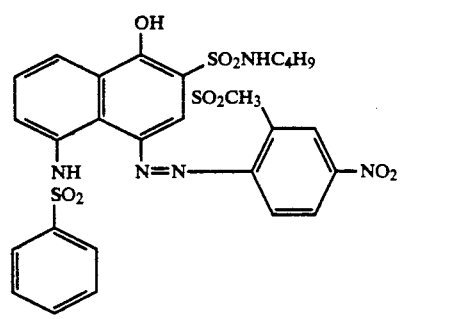 (VII-28)
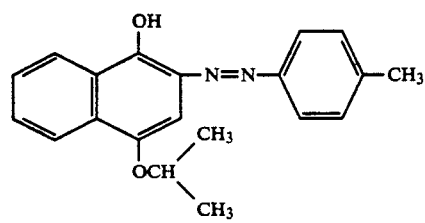 (VII-29)

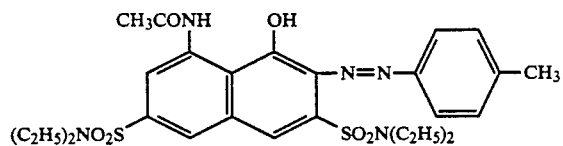
(VII-30)
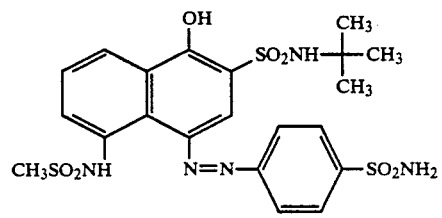
(VII-31)
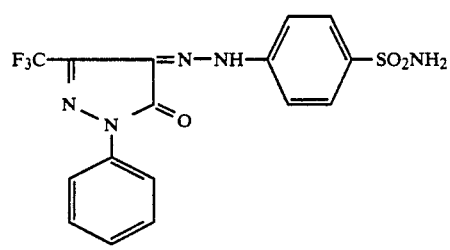
(VII-32)
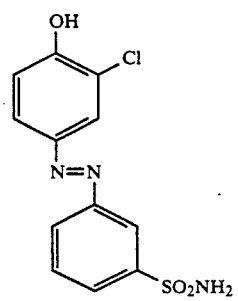
(VII-33)
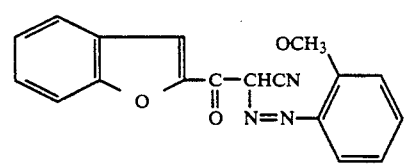
(VII-34)
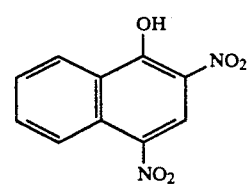
(VII-35)
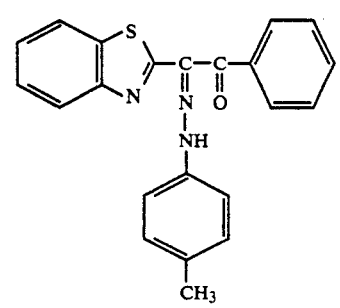
(VII-36)

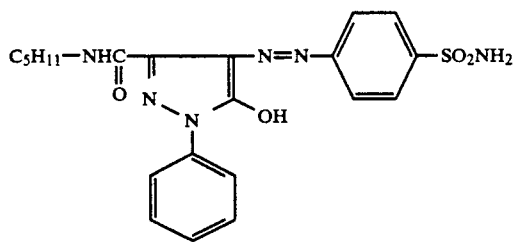

(VII-37)

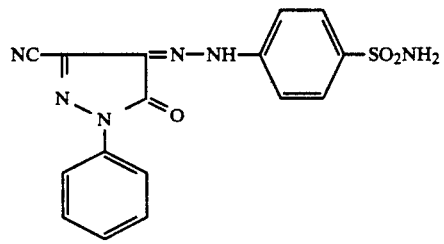

(VII-38)

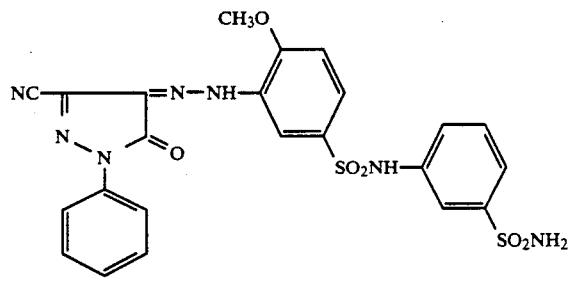

(VII-39)

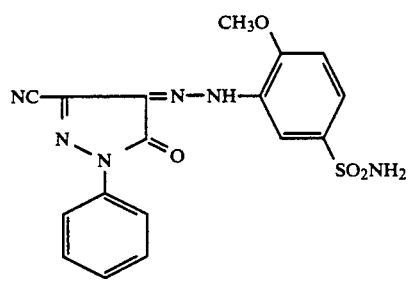

(VII-40)

Other types of dyes which are preferably used in this invention as the organic base materials are the dyes formed by the oxidation of the DRR compounds described in U.S. B351,673, U.S. Pat. Nos. 3,932,381, 3,928,312, 3,931,144, 3,954,476, 3,929,760, 3,942,987, 3,932,380, 4,013,635, and 4,013,633, JP-A-51-113624, JP-A-51-109928, JP-A-51-104343, JP-A-52-4891, JP-A-53-149328, Research Disclosure, pages 68–74 (November, 1976), and ibid., No. 13024 (1975).

Moreover, other types of dyes which are used in this invention are the dyes released by the reaction of the DDR couplers described in British Patents 840,781, 904,364, 932,272, 1,014,725, 1,038,331, 1,066,352, and 1,097,046, JP-A-51-133021, U.S. T (Defensive Publication) 900029, and U.S. Pat. No. 3,277,550 and the oxidation product of a color developing agent and the dyes formed by the reaction of the aforesaid DDR couplers and the oxidation product of a color developing agent.

Other types of dyes which are preferably used in this invention are the dye developing agents described in JP-B-35-182, JP-B-35-18332, JP-B-48-32130, JP-B-46-43950, and JP-B-49-2618.

Furthermore, still other types of dyes which are used in this invention are various dyes which are used in a silver dye bleaching process.

Suitable yellow dyes which can be used in a silver dye bleaching process include azo dyes such as Direct Fast Yellow GC (CI 29000) and Chrysophenine (CI 24895); benzoquinone dyes such as Indigo Golden Yellow IGK (CI 59101), Indigosol Yellow 2GB (CI 61726), Algol Yellow GCA-CF (CI 67301), Indanthrene Yellow GF (CI 68420), Mikethren Yellow GC (CI 67300), and Indanthrene Yellow 4GK (CI 68405); anthraquinone dyes; polycyclic soluble vat dyes; and other vat dyes.

Suitable magenta dyes which can be used in this invention include azo dyes such as Sumilight. Supra Rubinol B (CI 29225) and Benzo Brilliant Gelanine B (CI 15080); indigoid dyes such as Indigosol Brilliant Pink IR (CI 73361), Indigosol Violet 15R (CI 59321), Indigosol Violet IRRL (CI 59316), Indanthrene Red Violet RRK (CI 67895), and Mikethren Brilliant Violet BBK (CI 6335); soluble vat dyes such as benzoquinone and anthraquinone heterocyclic polycyclic compounds; and other vat dyes.

Suitable cyan dyes which can be used in this invention for the aforesaid purpose include azo dyes such as Direct Sky Blue 6B (CI 24410), Direct Brilliant Blue 2B (CI 22610), and Sumilight Supra Blue G (CI 34200); phthalocyanine dyes such as Sumilight Supra Turquoise Blue G (CI 74180) and Mikethren Brilliant Blue 4G (CI 74140); Indanthrene Turquoise Blue 5G (CI 69845); Indanthrene Blue GCD (CI 73066); Indigosol O4G (CI 73046); and Anthrasol Green IB (CI 59826).

As described above, the metal complexes for use in this invention stabilize the organic base materials. When these base materials are photographic additives such as couplers or dyes, the metal complexes and the base materials can be incorporated into the silver halide emulsion layers or other layers of the color photographic materials. Furthermore, these compounds may exist in any layer(s) included in the light-insensitive portion of color transfer materials.

The aforesaid metal complex compound represented by formula (I) or formula (II) described above can be used for stabilizing the aforesaid base material by dissolving the metal complex salt in a low-boiling organic solvent or in an organic solvent compatible with water, such as alcohols (e.g., methanol, ethanol, isopropanol, and butanol), ethers (e.g., dimethyl ether, ethyl methyl ether, diethyl ether, and 1-ethoxypropane), glycols (e.g., 1,2-ethanediol, 1,2-propanediol, and 1,3-propanediol), ketones (e.g., acetone, ethyl methyl ketone, and 3-pentanone), esters (e.g., ethyl formate, methyl acetate, and ethyl acetate), and amides (e.g., formamide, acetamide, and succinic acid amide) and adding the solution to a hydrophilic colloid constituting a photographic layer of a color photographic material. The step of the addition of the metal complex is preferably a step before coating, such as a step for producing a silver halide photographic emulsion, a step for dispersing by emulsification a coupler or couplers, and a step for preparing a photographic coating composition.

Also, for introducing the metal complex of this invention into a hydrophilic colloid for constituting a photographic layer, a method which is generally employed for dispersing a coupler(s) in a hydrophilic colloid can be used. For example, high-boiling organic solvents can be used for dissolving such materials as described in U.S. Pat. Nos. 2,304,939 and 2,322,027. Other applicable methods are described in U.S. Pat. Nos. 2,801,170, 2,801,171, and 2,949,360. In these methods, a low-boiling or water-soluble organic solvent is used together with a high-boiling organic solvent.

Representative examples of high-boiling organic solvents effective for dispersing the metal complexes for use in this invention and the organic base materials which are stabilized by the metal complexes are di-n-butyl phthalate, benzyl phthalate, triphenyl phosphate, tri-o-cresyl phosphate, diphenyl mono-p-tert-butylphenyl phosphate, monophenyl di-p-tert-butylphenyl phosphate, diphenyl mono-o-chlorophenyl phosphate, monophenyl di-o-chlorophenyl phosphate, 2,4-di-n-amylphenol, 2,4-di-t-amylphenol, and N,N-diethyllaurylamide as well as trioctyl phosphate and trihexyl phosphate described in U.S. Pat. No. 3,676,137.

Low-boiling solvents or water-soluble organic solvents which can be advantageously used with the high-boiling organic solvents are disclosed in U.S. Pat. Nos. 2,800,171, 2,801,170, and 2,949,360. These organic solvents include the following:

(1) substantially water-insoluble low-boiling organic solvents such as methyl acetate, ethyl acetate, propyl acetate, butyl acetate, isopropyl acetate, ethyl propionate, sec-butyl alcohol, ethyl formate, butyl formate, nitromethane, nitroethane, carbon tetrachloride, and chloroform; and (2) water-soluble organic solvents such as methyl isobutyl ketone, β-ethoxyethyl acetate, β-butoxytetrahydrofurfuryl adipate, diethylene glycol monoacetate, methoxytriglycol acetate, acetonitrile acetone, diacetone alcohol, ethylene glycol, diethylene glycol, dipropylene glycol, acetone, methanol, ethanol, acetonitrile, dimethyl formamide, and dioxane.

Both the base material and the complex for use in this invention can exist in one or more of the hydrophilic colloid layers of a photographic element. These materials may exist in a light-sensitive element or in a light-insensitive element such as a dye image-receiving material for a diffusion transfer photographic film unit. When the base material and the complex are used for such a light-insensitive image-recording element, it is preferred that the base material be mordanted. Accordingly, in such a system, it is preferred that the complex has a molecular form capable of being held in the mordant layer of an image-receiving material such that the complex is not diffused out from the dye to be stabilized.

When the present invention is applied for improving the light fastness of a photographic element such as an image transfer photographic film unit, there are several photographic film units to which the invention is effectively applied. For example, one type of such film unit is an imbibition dye-transfer film unit as described in U.S. Pat. No. 2,882,156 and another type thereof is a color image-transfer film unit as described in U.S. Pat. Nos. 2,087,817, 3,185,567, 2,983606, 3,253,915, 3,227,550, 3,227,551, 3,227,552, 3,415,644, 3,415,645, 3,415,646, 3,594,164 and 3,594,165, and Belgian Patents 756,959 and 7,577,960.

The complexes and organic base materials for use in this invention can be used with the materials described in *Production Licensing Index*, Vol. 92, No. 9232, pages 107–110 (Dec., 1971) in the manner according to the descriptions of the literature.

When using the metal complexes of this invention represented by formulae (I) or (II) described above for photographic materials, there is theoretically no upper limit on the amount thereof. However, the preferable amount of the complex is at least 1 micromole and more preferably from about 10 to $1 \times 10^4$ micromoles per square meter of the photographic light-sensitive material.

In general, the concentration of organic base material(s) may be the same as the concentration ordinarily used in color photographic technology. For example, the base material exists in an amount of preferably from about 10 to $10^4$ micromoles and more preferably from about 100 to $3 \times 10^3$ micromoles per square meter of the color photographic material.

The organic base material which is used together with the metal complex of this invention has generally the largest wavelength absorption peak in the wavelength region shorter than about 800 nm. The largest wavelength absorption peak of the base material is preferably in the range of from about 300 to 800 nm and more preferably in the range of from about 400 to 800 nm.

The photographic light-sensitive materials containing the metal complexes and the organic base material according to this invention may contain any type of support which is generally used for photographic light-sensitive material. For example, suitable types of supports include cellulose nitrate films, cellulose acetate films, cellulose acetate butyrate films, cellulose propionate films, polystyrene films, polyethylene terephthalate films, polycarbonate films, laminates of the aforesaid films, papers, baryta-coated papers, papers coated or laminated with an α-olefin polymer, in particular a polymer of an α-olefin having from 2 to 10 carbon atoms, such as polyethylene and polypropylene. Furthermore, plastic films having a roughened surface for improving adhesion with other high molecular types of material as described in JP-B-47-19068 are also preferably used.

The photographic light-sensitive materials of this invention may further contain various hydrophilic colloids. For example, a suitable hydrophilic colloid which may be used as a binder for silver halide photographic emulsion layers and/or other photographic layers includes gelatin, colloidal albumin, casein, cellulose derivatives (such as carboxymethyl cellulose and hydroxyethyl cellulose), saccharide derivatives (e.g., agar agar, sodium alginate, and starch derivatives), and synthetic hydrophilic colloids (such as polyvinyl alcohol, poly-N-vinylpyrrolidone, polyacrylic acid copolymers, maleic anhydride copolymers, polyacrylamide and derivatives or partially hydrolyzed products thereof. Two or more types of these colloids may be used as a compatible mixture thereof.

These hydrophilic colloids most generally contain gelatin and a part or the whole of gelatin may be replaced with a synthetic high molecular weight material. Furthermore, a so-called gelatin derivative, that is, a gelatin modified by treating the functional group thereof, such as an amino group, an imino group, a hydroxyl group, and a carboxyl group with a reagent having a group capable of reacting with the group or a graft polymer formed by bonding the molecular chain of the other high molecular weight material to gelatin can be used.

The photographic emulsion layers or the other layers of photographic light-sensitive materials to which the invention is applied may further contain synthetic polymers such as a latex-form water-dispersed vinyl polymer. In particular, these layers may contain compounds capable of improving the dimensional stability of the photographic material singly, as a mixture thereof, or as a combination thereof with a hydrophilic water-permeable colloid.

A silver halide photographic emulsion to which the invention is applied can be prepared by mixing an aqueous solution of a water-soluble silver salt (e.g., silver nitrate) and an aqueous solution of water-soluble halide(s) (e.g., potassium bromide) in the presence of an aqueous solution of a water-soluble polymer such as gelatin. Silver halide emulsions thus formed include silver chloride, silver bromide, and mixed silver halides, such as silver chlorobromide, silver iodobromide, and silver chloroiodobromide. These silver halide emulsions can be prepared by conventional methods. As a matter of course, the use of a single jet method, a double jet method, a controlled double jet method, etc., is advantageous for the preparation of the silver halide emulsion. Also, two or more types of silver halide emulsions separately prepared may be used as a mixture thereof.

The aforesaid silver halide photographic emulsions may contain various compounds or additives for preventing a reduction in sensivity and the formation of fog during production, storage, and processing of the photographic light-sensitive materials. Examples of such additives include 4-hydroxy-6-methyl-1,3,3a,7-tetraazaindene, 3-methylbenzothiazole, and 1-phenyl-5-mercaptotetrazole as well as various heterocyclic compounds, mercury-containing compounds, mercapto compounds, or metal salts.

The silver halide emulsion containing the materials of this invention can be chemically sensitized by an ordinary method. Examples of suitable chemical sensitizers include gold compounds such as chloroaurates and gold trichloride, salts of other noble metals such as platinum, palladium, iridium, and rhodium, sulfur compounds forming silver sulfide by reacting with a silver salt, such as sodium thiosulfate, stannous salts, amines, and other reducing maetrials.

The photographic emulsions to which the invention is applied can be, if necessary, subjected to spectral sensitization or supersensitization using cyanine dyes such as cyanines, merocyanines, and carbocyanines, singly or as a combination thereof, or as a combination thereof with styryl dye(s), etc. The dyes can be optionally selected according to the purposes and uses of the photographic light-sensitive materials, such as the wavelength region and sensitivity being sensitized.

The hydrophilic colloid layers of the photographic light-sensitive materials to which the invention is applied can be, if necessary, hardened by various hardening agents, such as aldehyde compounds, active halogen compounds, vinylsulfone compounds, carbodiimide compounds, N-methylol compounds, and epoxy compounds.

In one embodiment of the color photographic light-sensitive materials to which the invention is applied, the light-sensitive material is, after imagewise exposure, processed according to ordinary process to form color images. The main steps for the processing are color development, bleach and fix and, if necessary, include wash, stabilization, etc. In these steps, the bleach step and the fix step may be performed in one step as bleach-fix (blix) step. The color development is usually performed in an alkaline aqueous solution containing an aromatic primary amine color developing agent.

In another embodiment of the color photographic light-sensitive material to which the invention is applied, the color photographic material is a film unit for color diffusion transfer process. In this case, processing of the light-sensitive material is automatically performed inside the film unit wherein the developer is contained in a rupturable container. Examples of the color developing agent in the developer include the aforesaid aromatic primary amine color developing agents as well as N-methylaminophenol, 1-phenyl-3-pyrazolidone, 1-phenyl-4,4-dimethyl-3-pyrazolidone, 1-phenyl-4-methylhydroxymethyl-3-pyrazolidone, and 3-methoxy-N,N-diethyl-p-phenylenediamine.

The formation of color images in the photographic light-sensitive material to which the invention is applied includes a process of using the coupling reaction of the aforesaid dye-forming couplers and the oxidation product of a p-phenylenediamine color developing agent, a process of using dye developing agents, a process of using the oxidation cleavage reaction of DRR compounds, a process of using the split-off reaction of dyes by the coupling reaction of DRR couplers, a process of using the dye-forming reaction by the coupling reaction of DRR couplers, and a process of using silver dye bleaching process.

Accordingly, color photographic light-sensitive materials to which the invention is applied include color positive photographic films, color photographic papers, color negative photographic films, color reversal photographic films, color diffusion transfer photographic film units, and photographic light-sensitive materials for a silver dye bleaching process.

The organic base materials which are used with the metal complexes of this invention include methine dyes such as cyanine dyes, naphthoquinone dyes, indoaniline dyes, and azulene dyes, which are used for a high density optical recording medium such as a recording medium of an optical disk. Examples of these dyes are illustrated below but the invention is not limited to these dyes.

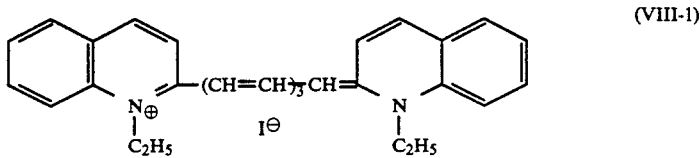

(VIII-1)

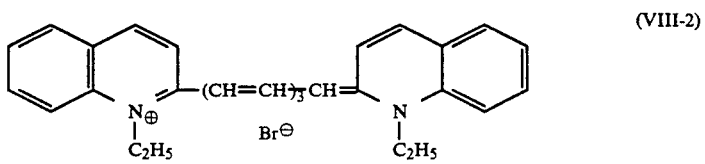

(VIII-2)

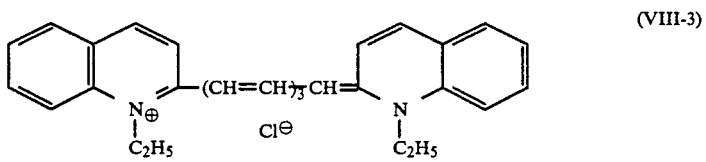

(VIII-3)

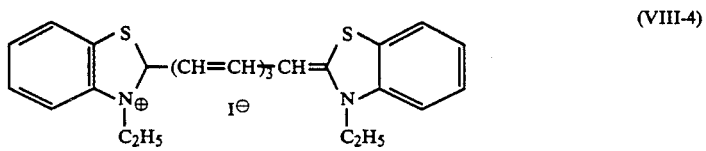

(VIII-4)

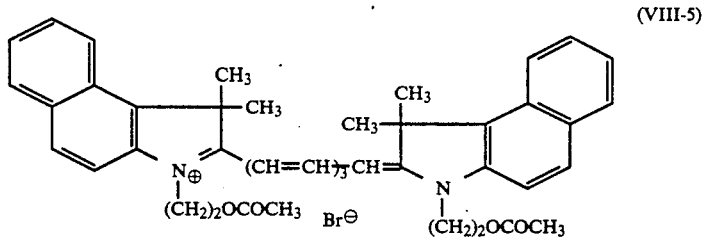

(VIII-5)

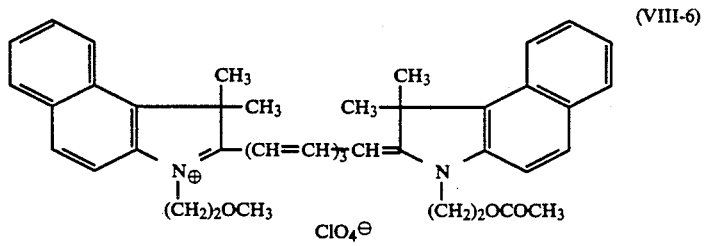

(VIII-6)

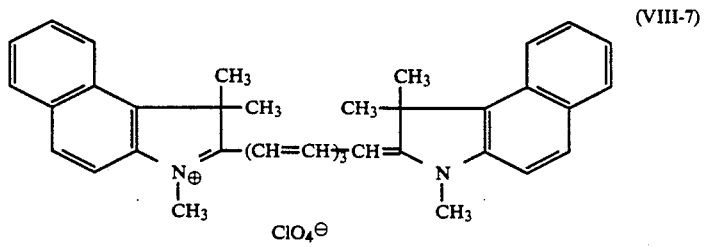

(VIII-7)

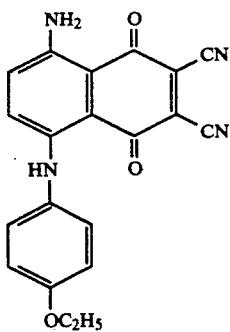 (VIII-8)

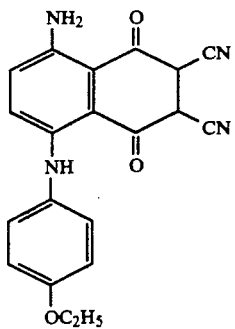 (VIII-9)

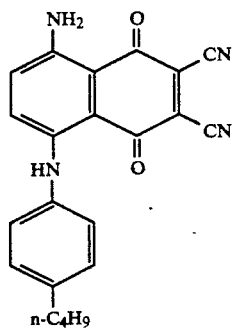 (VIII-10)

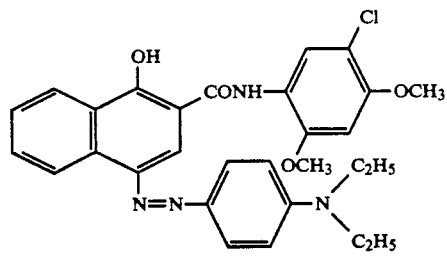 (VIII-11)

As described above, the metal complexes of formulae (I) or (II) described above for use in this invention can stabilize organic base materials. The effect of the stabilization is obtained when the metal complex and the organic base material are uniformly dispersed in a proper medium or binder. Examples of a suitable medium or binder are organic solvents or high molecular weight materials such as plastics. The organic solvents described above for dispersing the metal complexes in photographic layers are generally used as the solvent.

Examples of suitable plastics for use as the medium or binder are polyesters such as polyethylene terephthalate; cellulose esters such as cellulose diacetate, cellulose triacetate, and cellulose acetate butyrate; polyolefins such as polyethylene and polypropylene; polyvinyl compounds such as polyvinyl chloride, polyvinylidene chloride, a vinyl chloride-vinyl acetate copolymer and polystyrene; acrylic addition polymers such as polymethyl methacrylate; polycarbonate composed of polycarbonic acid ester; phenol resins; urethane resins; and hydrophilic binders such as gelatin.

Examples of the more preferred medium or binder are as follows:

i) Polyolefin:

For example, polyethylene, polypropylene, poly-4-methylpentene-1, etc.

ii) Polyolefin Copolymer:

For example, an ethylene-vinyl acetate copolymer, an ethylene-acrylic acid ester copolymer, an ethylene-acrylic acid copolymer, an ethylene-propylene copolymer, an ethylene-butene-1 copolymer, an ethylenemaleic anhydride copolymer, an ethylene-propylene terpolymer (EPT), etc. In this case, the copolymerization ratio can be optionally selected.

iii) Vinyl Chloride Copolymer:

For example, a vinyl acetate-vinyl chloride copolymer, a vinyl chloride-vinylidene chloride copolymer, a vinyl chloride-maleic anhydride copolymer, a copolymer of acrylic acid ester or methacrylic acid ester and vinyl chloride, an acrylonitrile-vinyl chloride copolymer, a vinyl chloride-ether copolymer, an ethylene- or propylene-vinyl chloride copolymer, a graft polymer of an ethylene-vinyl acetate copolymer with vinyl chloride, etc. In this case, the copolymerization ratio can be optionally selected.

iv) Vinylidene Chloride Copolymer:

For example, a vinylidene chloride-vinyl chloride copolymer, a vinylidene chloride-vinyl chloride-acrylonitrile copolymer, a vinylidene chloride-butadiene-vinyl halide copolymer, etc. In this case, the copolymerization ratio can be optionally selected.

v) Polystyrene vi) Styrene Copolymer:

For example, a styrene-acrylonitrile copolymer (AS resin), a styrene-acrylonitrile-butadiene copolymer (ABS resin), a styrene-maleic anhydride copolymer (SMA resin), a styrene-acrylic acid ester-acrylamide copolymer, a styrene butadiene copolymer (SBR), a styrene-vinylidene chloride copolymer, a styrene-methyl methacrylate copolymer, etc. In this case, the copolymerization ratio can be optionally selected.

vii) Styrene Polymer:

For example, α-methylstyrene, p-methylstyrene, 2,5-dichlorostyrene, α,β-vinylnaphthalene, α-vinylpyridine, acenaphthene, vinylanthracene, etc., and copolymers thereof, such as a copolymer of α-methylstyrene and a methacrylic acid ester.

viii) Coumarone-Indene Resin:

For example, a copolymer of coumarone, indene, and styrene.

ix) Terpene Resin and Picolite:

For example, a terpene resin which is a polymer of limonene obtained from α-pinene and picolite obtained from β-pinene.

x) Acrylic Resin:

The acrylic resin containing the atomic group shown by the following formula is particularly preferred:

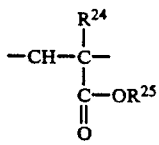

wherein $R^{24}$ represents hydrogen atom or an alkyl group; and $R^{25}$ represents a substituted or unsubstituted alkyl group. In this case, $R^{24}$ in the above formula is preferably hydrogen atom or a lower alkyl group having from 1 to 4 carbon atoms and is more preferably hydrogen atom or a methyl group.

Also, the alkyl group shown by $R^{24}$ may be substituted or unsubstituted but the carbon atom number of the alkyl group is preferably from 1 to 8. When $R^{24}$ is a substituted alkyl group, preferred examples of the substituent are hydroxyl group, a halogen atom, or an amino group (in particular, a dialkylamino group).

The atomic group shown by the above formula may form a copolymer with other recurring atomic groups to constitute various acrylic resins. However, an acrylic resin is usually constructed by forming a homopolymer or a copolymer containing one or more types of the atomic group shown by the above formula as a recurring unit.

xi) Polyacrylonitrile xii) Acrylonitrile Copolymer:

For example, an acrylonitrile-vinyl acetate copolymer, an acrylonitrile-vinyl chloride copolymer, an acrylonitrile-styrene copolymer, an acrylonitrile-vinylidene chloride copolymer, an acrylonitrile-vinyl-pyridine copolymer, an acrylonitrile-methyl methacrylate copolymer, an acrylonitrile-butadiene copolymer, an acrylonitrilebutyl acrylate copolymer, etc. In this case, the copolymerization ratio can be optionally selected.

xiii) Diacetoneacrylamide Polymer:

For example, a diacetoneacrylamide polymer obtained by reacting acrylonitrile and acetone.

xiv) Polyvinyl Acetate xv) Vinyl Acetate Copolymer:

For example, copolymers of vinyl acetate and an acrylic acid ester, vinyl ether, ethylene, vinyl chloride, etc. In this case, the copolymerization ratio can be optionally selected.

xvi) Polyvinyl Ether:

For example, polyvinyl methyl ether, polyvinyl ethyl ether, polyvinyl butyl ether, etc.

xvii) Polyamide:

Examples of polyamide are ordinary homonylons such as nylon 6, nylon 6-6, nylon 6-10, nylon 6-12, nylon 9, nylon 11, nylon 12, and nylon 13, polymers such as nylon 6/6-6/6-10, nylon 6/6-6/12, and nylon 6/6-6/11, and, as the case may be denatured nylon.

xviii) Polyester:

For example, preferably condensates or co-condensates of various dibasic acids such as aliphtic dibasic acids (e.g., oxalic acid, succinic acid, maleic acid, adipic acid, and sebacic acid) or aromatic dibasic acids (e.g., isophthalic acid and terephthalic acid) and glycols such as ethylene glycol, tetramethylene glycol, and hexamethylene glycol.

Also, in these polyesters, condensates of aliphatic dibasic acids and glycols and condensates of glycols and aliphatic dibasic acids are particularly preferred.

Furthermore, modified Glyptal resins formed by esterifying Glyptal resins which are condensates of phthalic anhydride and glycerol with a fatty acid or a natural resin are preferably used.

xix) Polyvinyl Acetal Resins:

For example, polyvinyl formal resins and polyvinyl acetal resin obtained by acetalating polyvinyl alcohol are preferably used. In this case, the acetalation degree of the polyvinyl acetal resins can be optionally selected.

xx) Polyurethane Resin:

For example, a thermoplastic polyurethane resin having an urethane bond. In particular, polyurethane resins obtained by the condensation of glycols and diisocyanates, and specifically polyurethane resins obtained by the condensation of alkylene glycols and alkylene diisocyanates are preferred.

xxi) Polyether:

For example, styrene-formalin resins, open chain polymers of cyclic acetal, polyethylene oxide, polyethylene glycol, polypropylene oxide, polypropylene glycol, a propylene oxide-ethylene oxide copolymer, polyphenylene oxide, etc.

xxii) Cellulose Derivatives:

For example, various cellulose esters and ethers, such as nitrocellulose, acetyl cellulose, ethyl cellulose, acetylbutyl cellulose, hydroxyethyl cellulose, hydroxypropyl cellulose, methyl cellulose, and ethylhydroxyethyl cellulose, and mixtures thereof.

xxiii) Polycarbonate:

For example, various polycarbonates such as polydioxydiphenylmethane carbonate, dioxydiphenylpropane carobate, etc.

xxiv) Ionomer:

For example, sodium, lithium, zinc, and magnesium salts of methacrylic acid or acrylic acid, etc.

xxv) Ketone Resin:

For example, condensates of cyclic ketones such as cyclohexanone and acetophenone, etc, and formaldehyde.

xxvi) Xylene Resin:

For example, condensates of m-xylene or mesitylene and formalin and the modified products thereof.

xxvii) Petroleum Resin:

For example, $C_5$ series, $C_9$ series, or $C_5-C_9$ copolymers, dicyclopentadiene copolymers and modified products of these copolymers, etc.

xxviii) Blends to two or more types of aforesaid materials i) to xxvii) and blends of the aforesaid materials i) to xxvii) and another thermoplastic resin.

In this mmbodiment, any amount of the metal complex gives the improvement of this invention. Moreover, since even an excessive amount thereof does not damage the product, although it may color the product, theoretically speaking, there is no upper limit on the amount thereof.

Furthermore, when using a plastic as a medium, it is preferable that the metal complex exists in an amount of at least 0.1 mol % and more preferably at least 1 mol % based on the amount of the organic base material.

Moreover, when using the metal complex and the organic base material of this invention, the addition of an ultraviolet absorbent to the system is effective for further improving the light fastness. Suitable examples of an ultraviolet absorbent include substituted or unsubstituted benzoic acid esters such as resorcinol monobenzoate and methyl salicylate; cinnamic acid esters such as butyl 2-oxy-3-methoxycinnamate; benzophenones such as 2,4-dioxybenzphenone; $\alpha,\beta$-unsaturated ketones such as dibenzalacetone; coumarins such as 5,7-dioxycoumarin; carbostyryls such as 1,4-dimethyl-7-oxycarbostyryl; and azoles such as 2-phenylbenzimidazole and 2-(2-hydroxyphenyl)benzotriazole.

The invention is described in more detail based on the following examples, in which all parts, unless otherwise indicated, are by weight.

The synthesis of a compound for use in this invention is explained by the following Synthesis Examples 1 and 2.

Synthesis Example 1

Synthesis of Compound (3)

To 20 ml of absolute ethanol were added 1.0 g of 4,5-(ethylenedithio)-1,3-dithiol-2-thione prepared according to an ordinary method and 2.0 g of potassium hydroxide followed by stirring for 2 hours at 50° C. When the reaction mixture was allowed to cool to room temperature, yellow crystals were precipitated. Then, the supernatant liquid was removed by decantation. 30 ml of ethanol was added to the system and the supernatant liquid was removed by decantation. Then, 20 ml of methanol was added thereto and the crystals formed were dissolved therein. When a solution of 0.3 g of nickel chloride (hexahydrate) dissolved in 20 ml of methanol was added to the solution while stirring at room temperature under a nitrogen gas atmosphere, the solution immediately became dark red. The solution was further stirred for 2 hours at room temperature.

Then, when air was blown into the solution, the solution immediately became dark green. The solution was stirred for 30 minutes while air was blown into the solution. Then, 2 g of tetrabutylphosphonium chloride powder was added to the solution to immediately deposit precipitates. The system was stirred for 30 minutes at room temperature and then the deposited precipitates were collected by filtration, washed with methanol, and air-dried. The precipitates thus obtained were dissolved in dichloromethane and the solution was filtrated. The filtrate obtained was concentrated and after adding thereto hot methanol, the mixture was allowed to cool overnight at room temperature. Then, the crystals thus deposited were collected by filtration, washed with methanol, and air-dried to provide 0.7 g of black crystals.

| $\lambda_{max}^{CH_2Cl_2}$ | 1,180 nm | |
|---|---|---|
| $\epsilon_{max}^{CH_2Cl_2}$ | $1.70 \times 10^4$ | $1 \cdot mol^{-1} \cdot cm^{-1}$ |
| m.p. | 200 to 202° C. | |

The electron spectrum of the product [Compound (3)] is shown in FIG. 1.

Synthesis Example 2

Synthesis of Compound (10)

In 200 ml of absolute methanol were added 11.8 g of 4,5-dibutylthio-1,3-dithiol-2-thione prepared by an ordinary method and 4.2 g of potassium hydroxide followed by refluxing for 10 minutes. 4.4 g of nickel acetate (tetrahydrate) was added to the reaction mixture as crystals and the mixture was stirred for 1.5 hours. The mixture was refluxed for one hour in an air atmosphere. Then, the solvent was distilled off from the reaction mixture and the residue was extracted with benzene. The extract was concentrated and applied to liquid chromatography using silica gel followed by developing with benzene. The dark green fraction was collected and after distilling off the solvent from the product, n-hexane was added thereto to provide a clear solution. The solution was allowed to cool overnight at 5° C. to deposit black crystals. Then, the crystals were washed with n-hexane and air-dried to provide 1.7 g of the desired compound.

| $\lambda_{max}^{CH_2Cl_2}$ | 1,000 nm |
|---|---|
| $\epsilon_{max}^{CH_2Cl_2}$ | $4.7 \times 10^4$ |
| m.p. | 97 to $100^2$ C. |

Figure 2:
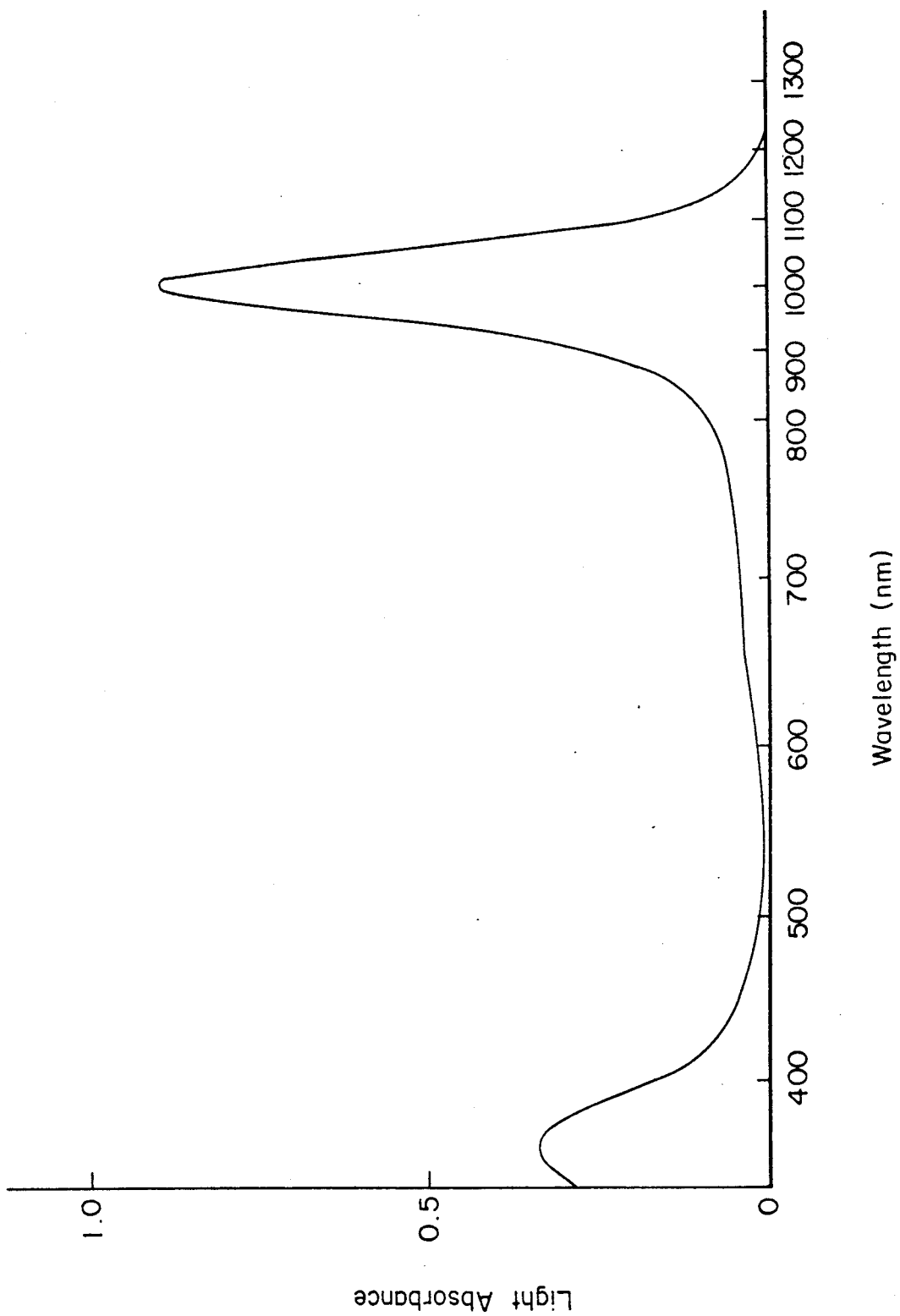
FIG. 2 is a graph showing the electron spectrum of Compound (10)

The electron spectrum of the product [Compound (10)] is shown in FIG. 2.

EXAMPLE 1

An infrared absorbent composition was prepared using Compound (3) prepared in Synthesis Example 1 and an optical filter was prepared using the composition.

The components shown below were mixed while stirring well, the mixture was filtered, coated on a metal support by a casting method to form a film thereof, and then the film was stripped off to provide an optical filter. In this step, several types of optical filters were prepared by changing the dry thickness thereof in the range of from 0.02 mm to 0.3 mm.

| Triacetyl Cellulose (TAC) Film | 170 parts |
|---|---|
| Triphenyl Phosphate (TPP) | 10 parts |
| Methylene Chloride | 800 parts |
| Methanol | 160 parts |
| Compound (3) | 2 parts |

EXAMPLE 2

An infrared absorbent composition was prepared using Compound (10) prepared in Synthesis Example 2 and an optical filter was prepared using the composition.

The components shown below were mixed while stirring well, filtered, coated on a metal support by a casting method to form a film, and the film thus formed was stripped off to provide an optical filter. Thus, several types of optical filters were prepared by changing the dry thickness in the range of from 0.02 mm to 0.3 mm.

| Triacetyl Cellulose (TAC) | 170 parts |
|---|---|
| Triphenyl Phosphate (TPP) | 10 parts |
| Methylene Chloride | 800 parts |
| Methanol | 160 parts |
| Compound (10) | 2 parts |

EXAMPLE 3

By following the same procedure as in Example 2, an optical filter of 0.19 mm in thickness containing an ultraviolet absorbent was prepared. The composition of the coating composition was as follows:

| Triacetyl Cellulose (TAC) | 170 parts |
|---|---|
| Triphenyl Phosphate (TPP) | 10 parts |
| Methylene Chloride | 800 parts |
| Methanol | 160 parts |
| Compound (10) | 2 parts |
| 2-(5-Tert-butyl-2-hydroxyphenyl)-benzotriazole [Compound (U)] | 0.2 part |

By using the metal complex in this invention with an ultraviolet absorbent, the light fastness of the optical filter is greatly improved.

The change of the optical density of the filter in the case of using Compound (10) and an ultraviolet absorbent, 2-(5-t-butyl-2-hydroxyphenyl)benzotriazole [Compound (U)] at a ratio of 10 : 1 under light irradiation with the passage of time is shown in the following table:

| Metal Complex in Filter | Xenon Lamp (120,000 lux) (irradiation time) | |
|---|---|---|
| | 0 hour 1,000 nm | 24 hours 1,000 nm |
| Compound (10) | 0.91 | 0.56 |
| Compound (10) + Compound (U) | 0.91 | 0.87 |

As is clear from the results in the above table, it can be seen that the light fastness of an optical filter can be greatly improved by using the metal complex with an ultraviolet absorbent.

EXAMPLE 4

To a polypropylene powder was added 0.2% by weight of Compound (3) prepared in Synthesis Example 1 and the mixture was pressed for one minute at 190° C. to form a film of 200 μm in thickness. The film was exposed by a xenon weather-ometer [Atlas weather-ometer (xenon 6.5 kW, illumunance 100,000 lux)] at a panel temperature of 60° C. and a relative humidity of 50%. The carbonyl index corresponding to the exposure time was measured and the deterioration of the polypropylene was determined. The results were compared to that of polypropylene containing none of the aforesaid additive as control. The results are shown in FIG. 3.

The carbonyl index is the value obtained by measuring the carbonyl group formed with the light deterioration of polypropylene by the infrared spectrum of the sample, that is, the extinction coefficient at 1,710 cm$^{-1}$ devided by the thickness (micron) of the sample.

Figure 3:
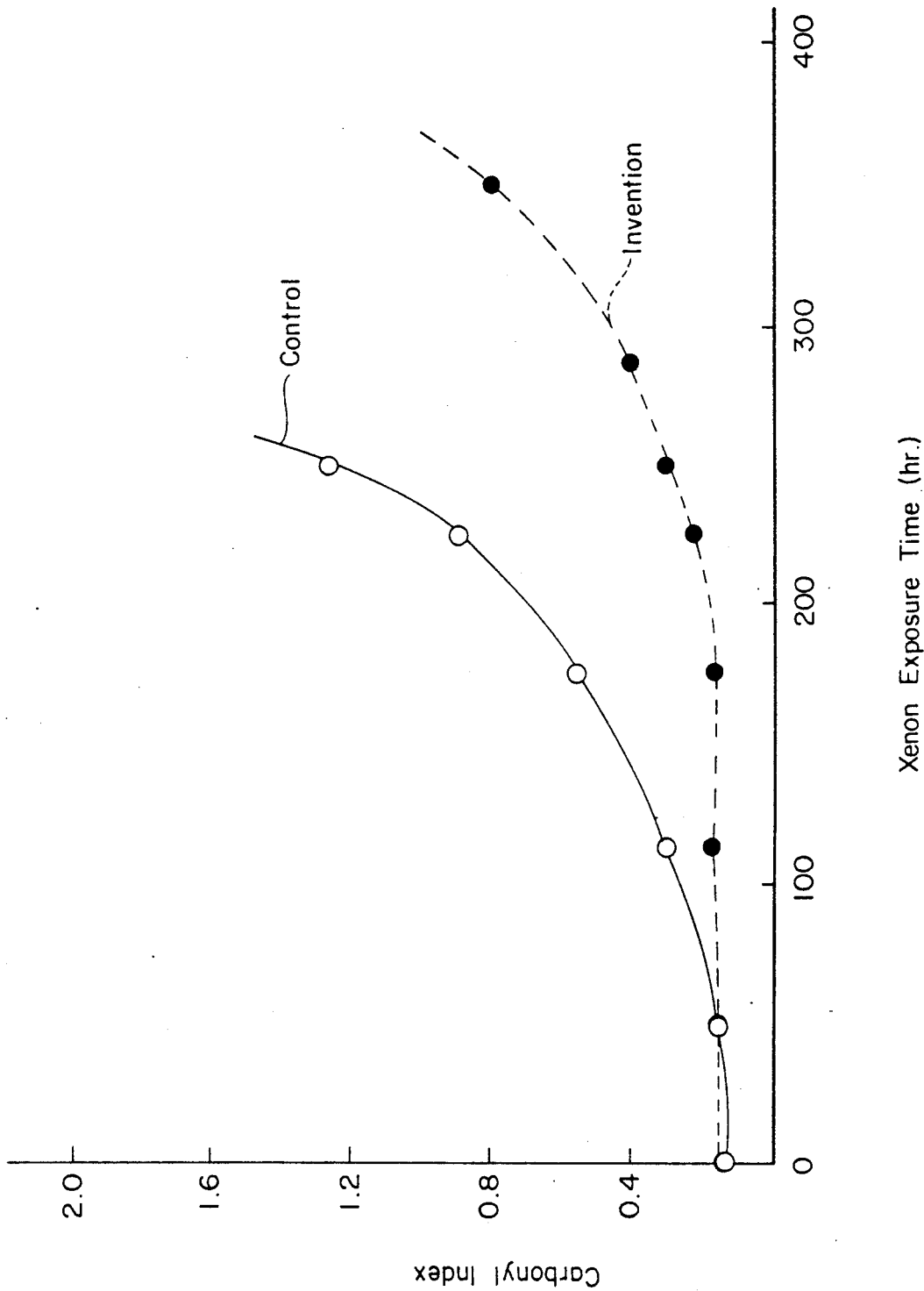
FIG. 3 is a graph showing the change of the carbonyl index of polypropylene measured in Example 4 using Compound (3) of this invention.

As is clear from the results shown in FIG. 3, it can be seen that Compound (3) had an effect of preventing the light deterioration of polypropylene.

EXAMPLE 5

In a mixture of 3 ml of tricresyl phosphate and 5 ml of ethyl acetate was dissolved 0.1 g of 1-(2,4,6-trichlorophenyl)-3-(2-chloro-5-tetradecanamido) anilino-4-{4-(N-ethyl-N-β-methanesulfonamidoethyl)aminophenylimino}-5-oxo-2-pyrazoline and the solution was dispersed by emulsification in 10 g of an aqueous 10% gelatin solution containing 1 ml of an aqueous solution of 1% sodium dodecylbenzenesulfonate. Then, the emulsified dispersion was mixed with 10 g of an aqueous 10% gelatin solution and the mixture was coated on a paper support having a polyethylene coating on both surfaces thereof and dried to provide a sample (Sample A).

Sample B was prepared in the same manner described above except that 30 mg of Compound (10) prepared in Synthesis Example 2 was added thereto in the case of preparing the aforesaid emulsified dispersion. Samples C and D were prepared by following the same procedure used for preparing Sample A, except that 15 mg and 150 mg of a known light fading preventing agent for dye, 2,5-di-tert-octylhydroquinone were added thereto, respectively in the case of preparing the emulsified dispersion. The coating amount of the dye was 60 mg/m$^2$ in each case. These Samples A to D were subjected to a fading test using a xenon tester (illuminance 200,000 lux) with an ultraviolet cut filter C-40 (made by Fuji Photo Film Co., Ltd.) for 48 hours. The results are shown in Table I.

TABLE I

| | Initial Density | Density After Test |
|---|---|---|
| Sample A | 0.82 | 0.12 |
| Sample B | 0.81 | 0.76 |
| Sample C | 0.81 | 0.21 |
| Sample D | 0.79 | 0.38 |

The density measurement was made by a Macbeth Densitomter Type 514 with a green Status AA filter.

The results confirm that Sample B containing Compound (10) in this invention shows much less fading as compared with Comparison Samples A, C, and D. In particular, Samples C and D containing di-tert-octylhydroquinone in equimolar amounts and 10 molar times that of Compound (10), respectively, show almost no effective fading prevention. This shows that Compound (10) in this invention has an astonishingly excellent effect for the light fading prevention of dyes.

EXAMPLE 6

In a mixture of 0.2 ml of 1N sodium hydroxide and 2 ml of methanol was dissolved 0.1 g of Compound (IX-2) and the solution was added to 10 g of an aqueous 10% gelatin solution. The mixture was coated on a paper support having a polyethylene coating on both surfaces at a coverage of Compound (IX-2) of 80 mg/m$^2$ to provide Sample E.

Samples F and G (comparison) were prepared by following the procedure as above except that a solution of 40 mg of Compound (3) of this invention dissolved in 2 ml of methanol was added to the aforesaid solution directly before coating or 20 mg of a known light fading preventing agent for dye, 2,5-di-tert-octylhydroquinone was added to the solution directly before coating. These samples were subjected to the fading test as in Example 5 using the same ultraviolet absorption filter for 12 hours. The results obtained are shown in Table II.

TABLE II

|  | Initial Density | Density After Test |
|---|---|---|
| Sample E | 0.90 | 0.11 |
| Sample F | 0.90 | 0.71 |
| Sample G | 0.91 | 0.29 |

The density measurement was performed by a Macbeth densitometer as in Example 5.

From the results, it can be seen that Compound (3) has very large light fading prevention effect.

EXAMPLE 7

In a mixture of 30 ml of tricresyl phosphate, 5 ml of dimethylformamide, and 15 ml of ethyl acetate was dissolved 10 g of a magenta coupler, 1-(2,4,6-trichlorophenyl)-3-{(2-chloro-5-tetradecanamido)anilino}-2-pyrazolin-5-one and the solution was dispersed by emulsification in 80 g of an aqueous 10% gelatin solution containing 8 ml of an aqueous solution of 1% sodium dodecylbenzenesulfonate.

The emulsified dispersion was then mixed with 145 g (containing 7 g of Ag) of a green-sensitive silver chlorobromide emulsion (Br 50 mol %). After adding thereto sodium dodecylbenzenesulfonate as a coating aid, the mixture was coated on a paper support having a polyethylene coating on both surfaces thereof to provide Sample H. The coverage of the coupler was 400 mg/m$^2$.

Sample I and Sample J (comparison sample) were prepared by following the same procedure as above except that 2.5 g of Compound (10) in this invention was added when preparing the aforesaid emulsified dispersion or 1.0 g of a known light fading preventing agent for dye, 2,5-di-tert-octylhydroquinone was similarly added. These samples were exposed for one second at 1000 lux and processed by the following processing solutions.

| Developer | |
|---|---|
| Benzyl Alcohol | 15 ml |
| Diethylenetriaminepentaacetic Acid | 5 g |
| Potassium Bromide | 0.4 g |

| -continued | |
|---|---|
| Na$_2$SO$_3$ | 5 g |
| Na$_2$CO$_3$ | 30 g |
| Hydroxylamine Sulfate | 2 g |
| 4-Amino-3-methyl-N-β-(methanesulfonamido)ethylaniline.3/2H$_2$SO$_4$.H$_2$O | 4.5 g |
| Water to make | 1 liter |
| pH | 10.1 |
| Blix Solution | |
| Ammonium Thiosulfate (70 wt %) | 150 ml |
| Na$_2$SO$_3$ | 5 g |
| Na[Fe(EDTA)] | 40 g |
| EDTA | 4 g |
| Water to make | 1 liter |
| pH | 6.8 |

| Processing Step | Temp. | Time |
|---|---|---|
| Development | 33° C. | 3 min. 30 sec. |
| Blix | 33° C. | 1 min. 30 sec. |
| Wash | 28 to 35° C. | 3 min. |

The samples having dye images formed thereon were exposed to sunlight for 2 weeks and an ultraviolet absorption filter C-40 (made by Fuji Photo Film Co., Ltd.) was used to cut light of wavelengths not longer than 400 nm. The results are shown in Table III.

The density measurement was made by measuring the densithy change of the portion having an initial density at 2.0 using a Macbeth densitometer RD-514 (Status AA filter).

TABLE II

|  | Density After Test | Dye Remaining Ratio |
|---|---|---|
| Sample H | 0.52 | 26% |
| Sample I | 1.76 | 82% |
| Sample J | 1.34 | 67% |

Dye Remaining Ratio = (density after fading/2.0) × 100.

From the results, it can be seen that Compound (10) in this invention is effective for fading prevention.

EXAMPLE 8

Fading tests for various base dyes in a dimethylformamide solution (20 ml) were performed in the presence of the metal complex. In the solution were dissolved $2 \times 10^{-4}$ mol of base dye and $6 \times 10^{-4}$ of metal complex before light irradiation.

The light exposure was performed by a xenon lamp (200,000 lux) having a UV cut filter and the exposure time was 200 hours. The results are shown in Table IV.

TABLE IV

| Test No. | Base Dye | Metal Complex | Dye Remaining Ratio (%) | Blank* (%) |
|---|---|---|---|---|
| 1 | VIII-1 | (3) | 82 | 0 |
| 2 | VIII-2 | (3) | 73 | 0 |
| 3 | VIII-3 | (10) | 86 | 0 |
| 4 | VIII-4 | (10) | 70 | 0 |
| 5 | VIII-7 | (10) | 85 | 0 |
| 6 | VIII-8 | (10) | 96 | 68 |

*Dye remaining ratio at exposing without adding metal complex

EXAMPLE 9

The components containing Compound (3) or (10) in this invention shown below were mixed while stirring well and the mixture was filtered and coated on a metal support by a casting method to form each film. The film was then stripped off to provide a film having a thickness of 25 microns.

| Composition of Film | |
|---|---|
| Triacetyl Cellulose (TAC) | 170 parts |
| Triphenyl Phosphate (TPP) | 10 parts |
| Methylene Chloride | 800 parts |
| Methanol | 160 parts |
| Compound (3) or (10) | 2 parts |
| Base Compound | 1 part |

Each film was exposed by a xenon lamp (200,000 lux) for 5 hours and then the dye remaining ratio was determined. The results are shown in Table V below.

TABLE V

| Test No. | Base Dye | Metal Complex | Dye Remaining Ratio (%) | Blank* (%) |
|---|---|---|---|---|
| 1 | VIII-1 | (3) | 92 | 36 |
| 2 | VIII-2 | (3) | 90 | 38 |
| 3 | VIII-3 | (10) | 88 | 41 |
| 4 | VIII-4 | (10) | 93 | 40 |
| 5 | VIII-7 | (10) | 90 | 35 |
| 6 | VIII-8 | (10) | 97 | 92 |

*Same as in TABLE IV

EXAMPLE 10

The solubility of the metal complexes in this invention represented by the following formula was measured:

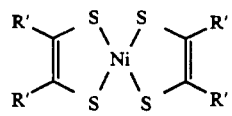

wherein R' represents the alkylthio group shown in Table VI below.

In addition, for comparison, the case of using the compound of the above formula wherein R' is an alkyl group shown in Table VI was also tested (Test Nos. 1 and 3). As an organic solvent, benzene or methylene chloride was used.

The solubility was measured as follows. 10 ml of a solvent and 1 g of the sample were placed in a 20 ml glass test tube equipped with a ground-in stopper. The test tube was shaken in a thermostat maintained at 15° C. for 24 hours, the system was allowed to stand, and the mixture was filtered. After distilling off the solvent from the filtrate, the weight of the residue was measured.

TABLE VI

| Test No. | R' in Complex | Solubility mg/10 ml benzene | Solubility mg/10 ml CH$_2$Cl$_2$ |
|---|---|---|---|
| 1 | CH$_3$ | 10 | 20 |
| 2 | CH$_3$S | 20 | 40 |
| 3 | n-C$_4$H$_9$ | 20 | 50 |
| 4 | n-C$_4$H$_9$S | 60 | 180 |

From the results shown above, it can be seen that in the case of using the metal complex in this invention, the solubility is improved.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An infrared absorbent composition comprising the metal complex compound represented by formula (I):

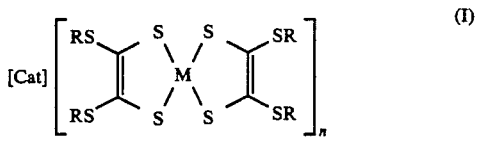

wherein represents a cation necessary for neutralizing the complex; n represents 1 or 2; M represents Cu, Co, Ni, Pd, or Pt; and R represents a substituted or an unsubstituted alkyl group, a substituted or an unsubstituted aryl group, or a substituted or an unsubstituted heterocyclic group; and two R's in the same ligand may combine with each other to form a ring, and a high molecular weight binder therefor.

2. The infrared absorbent composition as claimed in claim 1, wherein the composition further comprises an organic base material having an absorption maximum in the wavelength region of from about 300 nm to about 2000 nm.

3. The infrared absorbent composition as claimed in claim 1, wherein said infrared absorbent has an absorption maximum of 900 nm or longer.

4. The infrared absorbent composition as claimed in claim 1, wherein the cation is selected from the group consisting of a divalent inorganic cation, a divalent organic cation, a monovalent inorganic cation, and a monovalent organic cation.

5. The infrared absorbent composition as claimed in claim 1, wherein the cation is selected from the group consisting of formulae (Ia), (Ib), (Ic), (Id), (Ie), and (If):

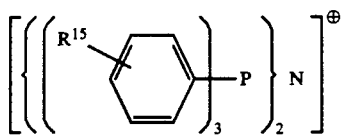

wherein $R^1$, $R^2$, $R^3$, $R^4$, $R^5$, $R^6$, $R^7$, $R^8$, $R^9$, $R^{10}$, $R^{11}$, $R^{12}$, $R^{13}$, $R^{14}$, and $R^{15}$ each independently represents an alkyl group having from 1 to 20 carbon atoms or an aryl group having from 6 to 14 carbon atoms, and wherein in formula (Ib) and (Ic) described above, $Z^1$ and $Z^2$ each represents a non metallic atomic group necessary for forming a substituted or unsubstituted 5-membered or 6-membered ring.

6. The infrared absorbent composition as claimed in claim 1, wherein the alkyl group represented by R comprises from 1 to 20 carbon atoms.

7. The infrared composition as claimed in claim 1, wherein the substituted alkyl group is substituted by at least one member selected from the group consisting of a cyano group, a hydroxyl group, a carboxyl group, a sulfo group, a halogen atom, a straight chain alkyl group, a branched alkyl group, an aryl group, an alkoxy group, an aryloxy group, an alkoxycarbonyl group, an aryloxycarbonyl group, an acyl group, an acyloxy group, an acylamino group, an anilino group, an alkylamino group, a carbamoyl group, a sulfonylamino group, and a sulfonyl group.

8. The infrared absorbent composition as claimed in claim 1, wherein the aryl group represented by R in formulae (I) or (II) comprises from 6 to 14 carbon atoms.

9. The infrared absorbent composition as claimed in claim 8, wherein the aryl group represented by R is a phenyl group which is substituted by at least one member selected from the group consisting of a methyl group, a methoxy group, a halogen atom, a nitro group, a cyano group, and a hydroxyl group.

10. The infrared absorbent composition as claimed in claim 1, wherein the heterocyclic group represented by R is a 5-membered or 6-membered heterocyclic group containing at least one nitrogen atom, oxygen atom, or sulfur atom in the ring.

11. The infrared absorbent composition as claimed in claim 1, wherein the heterocyclic group is substituted by a nitro group.

12. The infrared absorbent composition as claimed in claim 1, wherein the two R's in the same ligand combine with each other to form a 5- to 8-membered ring.

13. The infrared absorbent composition as claimed in claim 1, further comprising an ultraviolet absorbent.

14. An infrared absorbent film comprising the infrared absorbent composition as claimed in claim 1.

15. A photographic material comprising a support layer having thereon at least one light sensitive layer or at least one light-insensitive layer, wherein the infrared absorbent composition as claimed in claim 1 is positioned in at least one of said layers.

16. The infrared absorbent composition as claimed in claim 1, wherein the proportion of the metal complex compound is from 0.1 to 50 parts by weight per 100 parts by weight of the high molecular weight binder.

17. An infrared absorbent paint comprising the infrared absorbent composition as claimed in claim 1.

18. An ink comprising the infrared absorbent composition as claimed in claim 1.

19. A laser light recording/reading medium comprising the infrared absorbent composition as claimed in claim 1.

20. An infrared ray heat exchanging agent comprising the infrared absorbent composition as claimed in claim 1.

21. A resist material comprising the infrared absorbent composition as claimed in claim 1.

22. The infrared absorbent as claimed in claim 1, wherein the binder is a plastic or an inorganic material.

23. The infrared absorbent as claimed in claim 1, wherein the binder is a film forming binder.

24. An optical filter comprising an infrared absorbent composition containing at least one metal complex compound represented by formula (I):

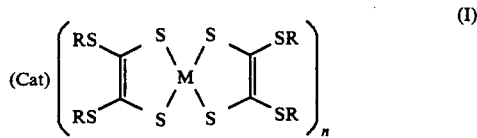

wherein (Cat) represents a cation necessary for neutralizing the complex; n represents 1 or 2; M represents Cu, Co, Ni, Pd, or Pt; and R represents a substituted or an unsubstituted alkyl group, a substituted or an unsubstituted aryl group, or a substituted or an unsubstituted heterocyclic group; and two R's in the same ligand may combine with each other to form a ring, and a high molecular weight binder therefor.

* * * * *